(12) United States Patent
Kubota et al.

(10) Patent No.: US 11,837,975 B2
(45) Date of Patent: Dec. 5, 2023

(54) PIEZOELECTRIC MATERIAL, PIEZOELECTRIC ELEMENT, AND ELECTRONIC EQUIPMENT

(71) Applicants: CANON KABUSHIKI KAISHA, Tokyo (JP); FUJI CHEMICAL CO., LTD., Osaka (JP)

(72) Inventors: Makoto Kubota, Yokohama (JP); Kanako Oshima, Tokyo (JP); Hisato Yabuta, Machida (JP); Takanori Matsuda, Chofu (JP); Miki Ueda, Tokyo (JP); Fumio Uchida, Daito (JP); Hiroki Imai, Nakatsugawa (JP); Kenji Maeda, Hirakata (JP); Chiemi Shimizu, Hirakata (JP)

(73) Assignee: CANON KABUSHIKI KAISHA, Tokyo (JP)

(*) Notice: Subject to any disclaimer, the term of this patent is extended or adjusted under 35 U.S.C. 154(b) by 801 days.

(21) Appl. No.: 16/775,542

(22) Filed: Jan. 29, 2020

(65) Prior Publication Data
US 2020/0169191 A1 May 28, 2020

Related U.S. Application Data

(63) Continuation of application No. PCT/JP2018/028867, filed on Aug. 1, 2018.

(30) Foreign Application Priority Data

Aug. 4, 2017 (JP) ................. 2017-151949

(51) Int. Cl.
*H02N 2/10* (2006.01)
*B41J 2/14* (2006.01)
(Continued)

(52) U.S. Cl.
CPC .......... *H02N 2/103* (2013.01); *B41J 2/14233* (2013.01); *C04B 35/495* (2013.01);
(Continued)

(58) Field of Classification Search
None
See application file for complete search history.

(56) References Cited

U.S. PATENT DOCUMENTS 8,518,290 B2   8/2013   Watanabe et al.
8,663,493 B2   3/2014   Matsuda et al.
(Continued)

FOREIGN PATENT DOCUMENTS

JP   10-203867 A    8/1998
JP   2009-227535 A  10/2009
(Continued)

OTHER PUBLICATIONS

International Preliminary Report on Patentability in International Application No. PCT/JP2018/028867 (dated Feb. 2020).
(Continued)

*Primary Examiner* — Erica S Lin
(74) *Attorney, Agent, or Firm* — Venable LLP

(57) ABSTRACT

A piezoelectric material includes: an oxide containing Na, Ba, Nb, Ti, and Mn, in which the oxide has a perovskite-type structure, a total amount of metal elements other than Na, Ba, Nb, Ti, and Mn contained in the piezoelectric material is 0.5 mol % or less with respect to a total amount of Na, Ba, Nb, Ti, and Mn, a molar ratio x of Ti to a total molar amount of Nb and Ti is $0.05 \leq x \leq 0.12$, a molar ratio y of Na to Nb is $0.93 \leq y \leq 0.98$, a molar ratio z of Ba to Ti is $1.09 \leq z \leq 1.60$, a molar ratio m of Mn to the total molar amount of Nb and Ti is $0.0006 \leq m \leq 0.0030$, and $1.07 \leq y \times z \leq 1.50$ is satisfied.

14 Claims, 7 Drawing Sheets

(51) Int. Cl.
 C04B 35/495 (2006.01)
 C04B 35/626 (2006.01)
 C04B 35/634 (2006.01)
 C04B 35/64 (2006.01)
 H04N 23/52 (2023.01)
 H10N 30/50 (2023.01)
 H10N 30/053 (2023.01)
 H10N 30/87 (2023.01)
 H10N 30/20 (2023.01)
 H10N 30/853 (2023.01)

(52) U.S. Cl.
 CPC .. *C04B 35/62695* (2013.01); *C04B 35/63416* (2013.01); *C04B 35/64* (2013.01); *H04N 23/52* (2023.01); *H10N 30/053* (2023.02); *H10N 30/2047* (2023.02); *H10N 30/50* (2023.02); *H10N 30/8536* (2023.02); *H10N 30/8542* (2023.02); *H10N 30/871* (2023.02); C04B 2235/3234 (2013.01); C04B 2235/3255 (2013.01); C04B 2235/3263 (2013.01); C04B 2235/6021 (2013.01); C04B 2235/6567 (2013.01); C04B 2235/768 (2013.01)

(56) References Cited

U.S. PATENT DOCUMENTS

| | | |
|---|---|---|
| 9,379,310 B2 | 6/2016 | Matsuda et al. |
| 9,496,484 B2 | 11/2016 | Ueda et al. |
| 9,595,658 B2 | 3/2017 | Matsuda et al. |
| 9,660,174 B2 | 5/2017 | Murakami et al. |
| 9,960,343 B2 | 5/2018 | Ueda et al. |
| 10,074,796 B2 | 9/2018 | Ueda et al. |
| 10,103,314 B2 | 10/2018 | Miura et al. |
| 10,516,093 B2 | 12/2019 | Ueda et al. |
| 2014/0125204 A1 | 5/2014 | Matsuda et al. |
| 2020/0169190 A1 | 5/2020 | Oshima et al. |
| 2020/0169192 A1 | 5/2020 | Matsuda et al. |

FOREIGN PATENT DOCUMENTS

| | | | |
|---|---|---|---|
| JP | 2014-62032 A | 4/2014 | |
| JP | 2014-168056 A | 9/2014 | |
| JP | 2016-197717 A | 11/2016 | |
| JP | 2016-197718 A | 11/2016 | |
| WO | WO-2016157854 A1 * | 10/2016 | ............ B32B 18/00 |
| WO | 2019/026941 A1 | 2/2019 | |
| WO | 2019/026960 A1 | 2/2019 | |
| WO | 2019/026964 A1 | 2/2019 | |

OTHER PUBLICATIONS

Notice of Reasons for Refusal in Japanese Application No. 2018-144198 (dated Feb. 2022).

International Search Report in International Application No. PCT/JP2018/028867 (dated Oct. 2018).

Saburo Nagakura et al. (ed.), Iwanami Physicochemical Dictionary, 5th Edition, p. 1268-1269 (Iwanami Shoten, Publishers; Feb. 20, 1998).

Wataru Sakamoto et al., "Lead-Free Piezoelectric Thin Films of Mn-Doped $NaNbO_3$—$BaTiO_3$ Fabricated by Chemical Solution Deposition," 518 Thin Solid Films 4256-4260 (Jan. 2010).

Oshima et al., U.S. Appl. No. 16/775,523, filed Jan. 29, 2020.

Kubota et al., U.S. Appl. No. 16/775,561, filed Jan. 29, 2020.

* cited by examiner

PIEZOELECTRIC MATERIAL, PIEZOELECTRIC ELEMENT, AND ELECTRONIC EQUIPMENT

CROSS-REFERENCE TO RELATED APPLICATIONS

This application is a Continuation of International Patent Application No. PCT/JP2018/028867, filed Aug. 1, 2018, which claims the benefit of Japanese Patent Application No. 2017-151949 filed on Aug. 4, 2017, both of which are hereby incorporated by reference herein in their entirety.

BACKGROUND OF THE INVENTION

Field of the Invention

The present disclosure relates to a piezoelectric material, and particularly to a piezoelectric element using a lead-free piezoelectric material. The present disclosure also relates to an electronic equipment using the piezoelectric element.

Description of the Related Art

Typical piezoelectric materials are $ABO_3$ perovskite-type metal oxides such as lead zirconate titanate (hereinafter referred to as "PZT") containing lead. Piezoelectric elements in which electrodes are provided on the surface of a piezoelectric material are used in various piezoelectric devices such as actuators, oscillators, sensors, and filters and electronic equipments.

However, since PZT contains lead as an A-site element, in a case where the PZT is discarded, there is a possibility that the lead component in the piezoelectric material may dissolve in the soil and harm the ecosystem. As such, there are issues about the effects on the environment. For this reason, various piezoelectric materials not containing lead (hereinafter referred to as "lead-free piezoelectric materials") have been examined.

An example of the lead-free piezoelectric material is a solid solution of sodium niobate ($NaNbO_3$) and barium titanate ($BaTiO_3$) (hereinafter referred to as "NN-BT"). Since NN-BT does not substantially contain potassium which causes difficulty in sintering and low moisture resistance, the piezoelectric characteristics hardly change over time. In addition, even in a case where NN-BT is used in a piezoelectric device, there is no phase transition in the crystal structure in a device operating temperature range (for example, from 0° C. to 80° C.), so that there is an advantage that the performance hardly varies depending on the operating temperature.

For example, Japanese Patent Application Laid-Open No. 2009-227535 discloses that by adding cobalt oxide (CoO) to NN-BT, a piezoelectric constant larger than that of the NN-BT in the related art can be obtained.

However, when attention is paid to the absolute value of a $d_{31}$ constant, the maximum piezoelectric constant in the example described in Japanese Patent Application Laid-Open No. 2009-227535 is about 56 pC/N of Sample No. 10. In addition, NN-BT has not only a problem of increasing the piezoelectric constant, but also a problem of further improving the Curie temperature, which is the upper limit temperature in a case of being used in a device. In the material system described in Japanese Patent Application Laid-Open No. 2009-227535, there are samples having a higher Curie temperature (Tc) than Sample No. 10, but the kr value of radial vibration decreases. That is, the piezoelectric constant and the Curie temperature are in a trade-off relationship. In addition, in a cobalt oxide added system, there has been a problem that electrical insulation properties such as resistance value and dielectric loss tangent degrade. For example, according to the description in paragraph [0028] of Japanese Patent Application Laid-Open No. 2009-227535, it is suggested that specimens having an insulation resistance of $1 \times 10^6 \Omega$ or less are mixed, and the dielectric loss tangent of the specimen of Sample No. 10 is as large as 2.1% (0.021). This trade-off relationship between the piezoelectric constant and the Curie temperature has hindered the practical application of piezoelectric devices using NN-BT piezoelectric materials.

The present disclosure has been made to solve such a problem, and provides a lead-free piezoelectric material primarily containing sodium niobate, which achieves both an excellent piezoelectric constant and a high Curie temperature. The present disclosure also provides a piezoelectric element and an electronic equipment using the piezoelectric material.

SUMMARY OF THE INVENTION

The piezoelectric material of the present disclosure that solves the above problems is a piezoelectric material including an oxide containing Na, Ba, Nb, Ti, and Mn, in which the oxide has a perovskite-type structure, a total amount of metal elements other than Na, Ba, Nb, Ti, and Mn contained in the piezoelectric material is 0.5 mol % or less with respect to a total amount of Na, Ba, Nb, Ti, and Mn, a molar ratio x of Ti to a total molar amount of Nb and Ti is $0.05 \leq x \leq 0.12$, and a molar ratio y of Na to Nb is $0.93 \leq y \leq 0.98$, a molar ratio z of Ba to Ti is $1.09 \leq z \leq 1.60$, a molar ratio m of Mn to the total molar amount of Nb and Ti is $0.0006 \leq m \leq 0.0030$, and $1.07 \leq y \times z \leq 1.50$ is satisfied.

A piezoelectric element according to the present disclosure is a piezoelectric element including a first electrode, a piezoelectric material portion, and a second electrode, in which a piezoelectric material forming the piezoelectric material portion is the above-described piezoelectric material. An electronic equipment according to the present disclosure includes the above-described piezoelectric element.

Further features of the present disclosure will become apparent from the following description of exemplary embodiments with reference to the attached drawings.

DESCRIPTION OF THE EMBODIMENTS

Figure 1:
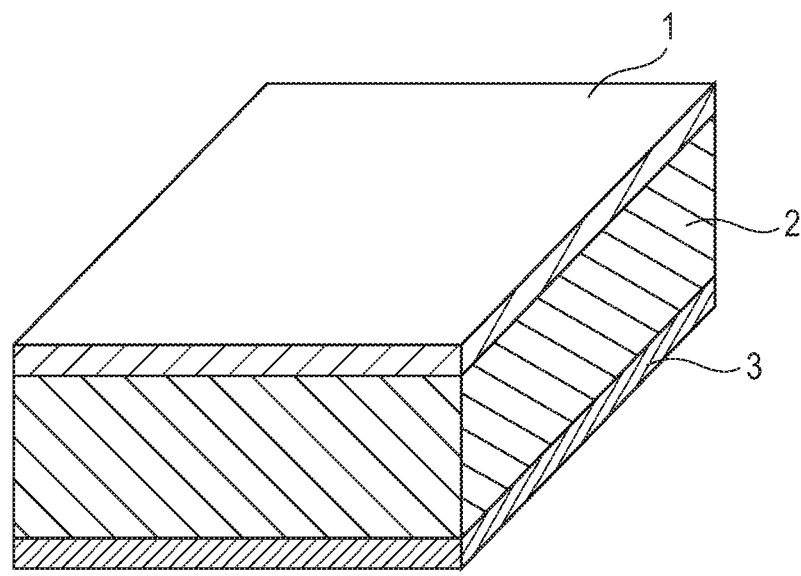
FIG. 1 is a schematic perspective view of a piezoelectric element, illustrating an embodiment of the present disclosure.

Hereinafter, embodiments of the present disclosure will be described.

The present disclosure provides a lead-free, potassium-free piezoelectric material that is based on a NN-BT having a novel composition and is good in both piezoelectric constant at room temperature and Curie temperature. The piezoelectric material of the present disclosure can be used for various applications such as a capacitor, a memory, and a sensor, by utilizing the characteristics as a dielectric.

The piezoelectric material of the present disclosure has the following features.

(1) The piezoelectric material contains an oxide containing Na, Ba, Nb, Ti, and Mn.
(2) The oxide has a perovskite-type structure.
(3) The total amount of metal elements other than Na, Ba, Nb, Ti, and Mn contained in the piezoelectric material is 0.5 mol % or less with respect to the total amount of Na, Ba, Nb, Ti, and Mn.
(4) The molar ratio x of Ti to the total molar amount of Nb and Ti is $0.05 \leq x \leq 0.12$.
(5) The molar ratio y of Na to Nb is $0.93 \leq y \leq 0.98$.
(6) The molar ratio z of Ba to Ti is $1.09 \leq z \leq 1.60$.
(7) The molar ratio m of Mn to the total molar amount of Nb and Ti is $0.0006 \leq m \leq 0.0030$.
(8) $1.07 \leq y \times z \leq 1.50$ is satisfied.

(Feature 1)

The piezoelectric material of the present disclosure includes an oxide containing Na, Ba, Nb, Ti, and Mn.

When the piezoelectric material simultaneously contains Na, Ba, Nb, Ti, and O as primary components, the piezoelectric constant of the piezoelectric material is increased and variation in each characteristic in a device operating temperature range (for example, 0° C. to 80° C.) can be reduced.

When the piezoelectric material contains a small amount of Mn in addition to the primary components Na, Ba, Nb, Ti, and O, the piezoelectric constant of the piezoelectric material increases, and the dielectric loss tangent is significantly suppressed to, for example, less than 2% at 1 kHz.

(Feature 2)

The crystal structure of the oxide containing Na, Ba, Nb, Ti, and Mn is a perovskite type structure. Since the oxide has a perovskite-type structure, the piezoelectric material of the present disclosure exhibits a large piezoelectric constant.

The crystal structure is desirably a so-called single phase formed only of a perovskite-type structure. For example, when a tungsten bronze type structure is mixed, there is concern that the piezoelectric constant may be significantly reduced.

In the present disclosure, a perovskite-type metal oxide indicates a metal oxide having a perovskite-type structure (also referred to as perovskite structure) which is ideally a cubic crystal structure as described in Iwanami Dictionary of Physics and Chemistry, 5th Edition (published on Feb. 20, 1998, by Iwanami Shoten). A metal oxide having a perovskite-type structure is generally expressed by a chemical formula $ABO_3$. In the perovskite-type metal oxide, the elements A and B occupy specific positions of unit cells called A sites and B sites in the form of ions, respectively. For example, in the case of cubic unit cells, the A elements are located at the vertices positions of the cube and the B element is located at the body center. The O elements occupy the face-centered positions of the cube as anions of oxygen. The A-site elements are in 12-fold coordination, and the B-site elements are in 6-fold coordination. When the A elements, the B elements, and the O elements are slightly shifted in coordinates from the symmetrical positions of the unit cell, the unit cell of the perovskite-type structure is distorted to become a crystal system such as a tetragonal, rhombohedral, or orthorhombic crystal system.

In the material of the present disclosure, Na and Ba are located at the A site and Nb and Ti are located at the B site. However, since the composition is intentionally designed so that the Na/Nb ratio is smaller than 1 in the stoichiometric ratio and the Ba/Ti ratio is larger than 1 in the stoichiometric ratio, the ratio between the A-site elements, B-site elements, and oxygen elements in the entire metal oxide is not necessarily 1:1:3. Even in such a case, when the oxide has a perovskite-type structure as a primary phase, the oxide is included in the scope of the present disclosure. Whether the oxide has a perovskite-type structure can be determined from, for example, measurement results of X-ray diffraction and electron beam diffraction performed on a piezoelectric material.

(Feature 3)

The total amount of metal elements other than Na, Ba, Nb, Ti, and Mn contained in the piezoelectric material of the present disclosure is 0.5 mol % or less with respect to the total amount of Na, Ba, Nb, Ti, and Mn. Furthermore, when the composition of the piezoelectric material of the present disclosure is analyzed, the largest six elements in abundances as molar amounts can be Na, Ba, Nb, Ti, Mn, and O.

Since Na, Ba, Nb, Ti, and Mn occupy almost the entire amount of the metal components of the piezoelectric material, the effect of simultaneously improving both the piezoelectric constant and the Curie temperature, which is the aim of the present disclosure, is strongly obtained. Other metal elements may be added for the purpose of adjusting other physical properties of the piezoelectric material, but the total addition amount thereof is set to 0.5 mol % or less with respect to the total amount of Na, Ba, Nb, Ti, and Mn. When the metal elements other than Na, Ba, Nb, Ti, and Mn are added in a total amount exceeding 0.5 mol % with respect to the total amount of Na, Ba, Nb, Ti, and Mn, the material deviates from the concept of the design of the composition of the present disclosure, and the effect of simultaneously improving both the piezoelectric constant and the Curie temperature may be impaired. The total amount of the metal elements other than Na, Ba, Nb, Ti, and Mn is more desirably 0.2 mol % or less with respect to the total amount of Na, Ba, Nb, Ti, and Mn.

(Feature 4)

In the piezoelectric material of the present disclosure, the molar ratio x of Ti with respect to the total molar amount of Nb and Ti is $0.05 \leq x \leq 0.12$. By causing the value of x to be 0.05 or more, crystallization of the piezoelectric material is promoted, and mechanical strength and density required for mounting the piezoelectric material on an electronic equipment can be obtained. On the other hand, by causing the value of x to be 0.12 or less, the characteristics of sodium niobate, which is the primary component, are emphasized, and both a Curie temperature of 190° C. or more and a piezoelectric constant $|d_{31}|$ of 60 pm/V or more are obtained. A more desirable range of x is $0.06 \leq x \leq 0.11$. By causing the value of x to be 0.11 or less, a Curie temperature of 205° C. or more is achieved.

The piezoelectric constant $d_{31}$ is generally expressed as a negative value, but in this specification, the absolute value is taken for evaluation.

(Features 5, 6, and 8)

In the piezoelectric material of the present disclosure, the molar ratio y of Na to Nb is $0.93 \leq y \leq 0.98$. The molar ratio z of Ba to Ti is $1.09 \leq z \leq 1.60$, and the correlation between these two parameters y and z is $1.07 \leq y \times z \leq 1.50$.

In the piezoelectric material of the present disclosure, the composition ratios of $Nb^{5+}$ and $Ba^{2+}$ are caused to be excessive compared to those of the stoichiometric ratio of $NaNbO_3$—$BaTiO_3$ (NN-BT) in the related art, a state in which a pseudo $Ba_{0.5\square 0.5}NbO_3$ perovskite-type metal oxide is dissolved as a solid solution in NN-BT is created.

Here, the symbol "$\square$" intends a defect site (also referred to as a deficient site) in which no element is disposed at a site having a perovskite-type structure. This defect site can be regarded as a pseudo zerovalent element. The presence of this defect site cannot be identified directly from the piezoelectric material. However, assuming that there is a defect site in the piezoelectric material, a perovskite-type structure having a charge balance in which the A site is pseudo-monovalent ($2 \times 0.5 + 0 \times 0.5$) and the B site is pentavalent is achieved, and the high electrical insulation properties of the piezoelectric material of the present disclosure can be described.

NN-BT is an antiferroelectric material and is an existing material that realizes a high Curie temperature and a piezoelectric constant by dissolving barium titanate, which is a ferroelectric material, as a solid solution in a sodium niobate component that does not have piezoelectricity. However, there is a demand to further improve both the Curie temperature and the piezoelectric constant. Here, by dissolving an appropriate amount of the $Ba_{0.5\square 0.5}NbO_3$ metal oxide having Ba with a relatively large atomic weight in the A site in NN-BT as a solid solution, the tetragonality (lattice strain) of the perovskite-type metal oxide is increased from the viewpoint of tolerance factor, and an effect of increasing both the Curie temperature and the piezoelectric constant is obtained.

This increase in tetragonality can be confirmed by comparing X-ray diffraction images of the NN-BT with y=1 and z=1 and the piezoelectric material of the present disclosure.

However, the composition formula $Ba_{0.5\square 0.5}NbO_3$ is a convenient notation for describing a typical case, and the molar ratio of Ba and Nb added to the stoichiometric ratio of NN-BT need not be strictly 0.5:1, that is, 1:2. As described above, when $0.93 \leq y \leq 0.98$, $1.09 \leq z \leq 1.60$, and the relationship of $1.07 \leq y \times z \leq 1.50$ are satisfied, the effects of the present disclosure are obtained. For example, the molar ratio of Ba and Nb added to NN-BT within the range of the relational expression of y and z may be 0.8:1, that is, $Ba_{0.8\square 0.2}NbO_3$.

As described above, in the present disclosure, since the composition ratio of $Nb^{5+}$ is caused to be more excessive than that in NN-BT in the related art, the range of y representing the Na/Nb ratio of the entire piezoelectric material becomes $0.93 \leq y \leq 0.98$. By causing the value of y to be 0.98 or less, a composition in which a large amount of the $Ba_{0.5\square 0.5}NbO_3$ perovskite-type metal oxide is dissolved as a solid solution is obtained, and the effect of improving both the Curie temperature and the piezoelectric constant is obtained. On the other hand, by causing the value of y to be 0.93 or more, the appearance of a non-perovskite-type structure, particularly a tungsten bronze type structure, can be suppressed, and a high piezoelectric constant can be obtained.

A more desirable range of the value of y is $0.94 \leq y \leq 0.97$.

As described above, in the present disclosure, since the composition ratio of $Ba^{2+}$ is caused to be more excessive than NN-BT in the related art, the range of z representing the Ba/Ti ratio of the entire piezoelectric material becomes $1.09 \leq z \leq 1.60$. By causing the value of z to be 1.09 or more, a composition in which a large amount of the $Ba_{0.5\square 0.5}NbO_3$ component is dissolved as a solid solution in the $BaTiO_3$ component is obtained, and the above-described effect of improving the Curie temperature is obtained. On the other hand, by causing the value of z to be 1.60 or less, the appearance of a non-perovskite-type structure, particularly a tungsten bronze type structure, can be suppressed, and a high piezoelectric constant can be obtained.

A more desirable range of the value of z is $1.20 \leq z \leq 1.50$.

There is a correlation between the excess of $Nb^{5+}$ and the excess of $Ba^{2+}$ in order to obtain the effect of simultaneously improving both the Curie temperature and the piezoelectric constant of the present disclosure. The relationship is expressed by the relational expression $1.07 \leq y \times z \leq 1.50$. Here, "$y \times z$" represents a product (that is, y·z) of the value of the molar ratio y of Na to Nb and the value of the molar ratio z of Ba to Ti in the piezoelectric material of the present disclosure. It can be said that y is the reciprocal of the excess of $Nb^{5+}$. By causing the value of y×z to be 1.07 or more, the effect of simultaneously improving both the Curie temperature and the piezoelectric constant is significantly exhibited, and by causing the value of y×z to be 1.50 or less, a decrease in the piezoelectric constant caused by the appearance of a non-perovskite-type structure can be avoided.

A more desirable range of the value of y×z is $1.10 \leq y \times z \leq 1.42$.

(Feature 7)

In the piezoelectric material of the present disclosure, the molar ratio m of Mn to the total molar amount of Nb and Ti is $0.0006 \leq m \leq 0.0030$.

In the piezoelectric material of the present disclosure, the valence-variable Mn component plays a role of compensating for the charge balance, and can suppress the electrical loss of the piezoelectric material by being present in the piezoelectric material in the molar ratio range. For example, the Mn component contributes to the improvement of parameters related to electrical loss such as insulation, dielectric loss tangent, and ease of a polarization treatment.

When the value of m is 0.0006 or more, that is, 0.06% or more, an effect of suppressing electrical loss such as dielectric loss tangent is obtained. On the other hand, when the m value is 0.0030 or less, that is, 0.30% or less, electrical loss such as dielectric loss tangent does not increase due to excessive Mn.

A more desirable range of the value of m is $0.0008 \leq m \leq 0.0020$.

(Effect Confirmation Method, Curie Temperature)

The Curie temperature is a temperature above which a piezoelectric material loses piezoelectricity, or higher. In the claims and specification of the present application, the temperature at which the capacitance becomes maximum near the phase transition temperature between the ferroelectric phase and the paraelectric phase is defined as the Curie temperature. For example, the Curie temperature can be obtained by measuring the capacitance at 1 kHz with an impedance analyzer (for example, 4194A (trade name) manufactured by Keysight Technologies (former Agilent Technologies)) while changing the temperature of the piezoelectric material provided with electrodes.

In a case of evaluating the Curie temperature of a single piezoelectric material having no electrode, an X-ray diffraction image of a specimen obtained by crushing and pulverizing the piezoelectric material is measured, for example, in a range of room temperature to 300° C., and the temperature at which the phase transition from the ferroelectric structure to the paraelectric structure occurs can be regarded as the Curie temperature.

It can be said that it is effective when the Curie temperature of the piezoelectric material of the present disclosure is 190° C. or more to 400° C. or less. A more desirable lower limit of the Curie temperature is 205° C., and the Curie temperature is desirably 235° C. or more to 400° C. or less. When the Curie temperature of the piezoelectric material is 190° C. or more, the piezoelectric constant of the piezoelectric material does not decrease even when a heating process such as a thermocompression bonding process of a resin is performed when an element is processed after the piezoelectric material is subjected to a polarization treatment, which is desirable. On the other hand, when the Curie temperature of the piezoelectric material is 400° C. or less, the polarization treatment for the piezoelectric material is facilitated.

(Effect Confirmation Method, Piezoelectric Constant)

Here, the piezoelectric constant is an amount indicating the degree of displacement (extension, contraction, and shear) of the piezoelectric material when a voltage is applied to the piezoelectric material. For example, the piezoelectric constant $d_{31}$ is a proportional coefficient of the voltage with respect to contraction (extension) displacement in a direction orthogonal to the polarization direction when a voltage is applied in the polarization direction of the piezoelectric material (usually the direction in which the voltage is applied during the polarization treatment), that is, the amount of displacement per unit voltage. Conversely, the piezoelectric constant $d_{31}$ can also be defined as the amount of charge induced when stress is applied to the material.

The piezoelectric constant of the piezoelectric material can be obtained by calculation from the measurement results of the resonance frequency and antiresonance frequency obtained using a commercially available impedance analyzer, based on the standard of Japan Electronics and Information Technology Industries Association (JEITA EM-4501). In this specification, unless otherwise stated, measurement of the piezoelectric constant at room temperature, for example, in an environment at 25° C. is intended. This measurement method is called a resonance-antiresonance method.

In addition to the resonance-antiresonance method, the piezoelectric constant can be calculated by measuring the amount of displacement when a voltage is applied or by measuring the amount of charge induced when a stress is applied.

(Ratio of Ba and Na)

b representing the molar ratio of Ba to the total molar amount of Na and Ba contained in the piezoelectric material is desirably $0.08 \leq b \leq 0.13$.

By causing the value of b to be 0.08 or more, crystallization of the piezoelectric material is promoted, and mechanical strength and density required for mounting the piezoelectric material on an electronic equipment can be obtained. On the other hand, by causing the value of b to be 0.13 or less, the characteristics of sodium niobate, which is the primary component, are emphasized, and both a Curie temperature of 190° C. or more and a piezoelectric constant $d_{31}$ of 60 pm/V or more are obtained. A more desirable range of the value of b is $0.09 \leq b \leq 0.12$.

(Pb Component, K Component)

The total amount of a Pb component and a K component contained in the piezoelectric material is desirably less than 1000 ppm.

More desirably, the amount of the Pb component contained in the piezoelectric material is less than 500 ppm, and the amount of the K component is less than 500 ppm. Even more desirably, the total amount of the Pb component and the K component is less than 500 ppm.

When the amount of the Pb component contained in the piezoelectric material of the present disclosure is suppressed, the influence of the Pb component released into the environment when the piezoelectric material is left in water or soil can be reduced.

When the amount of the K component contained in the piezoelectric material of the present disclosure is suppressed, the moisture resistance of the piezoelectric material and the efficiency thereof during high-speed vibration are increased.

(Dielectric Loss Tangent)

The dielectric loss tangent of the piezoelectric material of the present disclosure at room temperature is desirably 0.02 or less (2% or less). When the dielectric loss tangent at room temperature is 0.02 or less, the power consumption of the piezoelectric element or electronic equipment using the piezoelectric material of the present disclosure can be suppressed. The dielectric loss tangent at room temperature is more desirably 0.013 or less (1.3% or less), and even more desirably 0.01 or less (1% or less).

The dielectric loss tangent of the piezoelectric material at room temperature can be measured, for example, at a frequency of 1 kHz using a commercially available impedance analyzer after applying an electrode to the piezoelectric material.

(Method of Manufacturing Piezoelectric Material)

The piezoelectric material of the present disclosure is characterized by constituent components, composition ratio, and crystal structure, but the manufacturing method thereof is not particularly limited. The piezoelectric material of the present disclosure can be obtained by a general inorganic oxide synthesis method. Hereinafter, an example of a desirable manufacturing method will be described.

In order to obtain a piezoelectric ceramic that is one embodiment of the piezoelectric material of the present disclosure, first, a compact for baking is produced. Here, ceramics represent so-called polycrystals, which are an aggregate (also referred to as a bulk body) of crystal grains whose basic component is a metal oxide and is baked and hardened by a heat treatment. Those processed after sintering are also included in the ceramics. The compact is a solid substance into which a raw material powder is formed.

The raw material powder desirably has a higher purity.

Examples of a metal compound powder that can be used as the raw material powder include a Mn compound, a Na compound, a Nb compound, a Ba compound, a Ti compound, and a composite compound thereof.

Examples of the Mn compound that can be used include manganese oxide and manganese acetate.

Examples of the Na compound that can be used include sodium carbonate and sodium niobate.

Examples of the Nb compound that can be used include niobium oxide, sodium niobate, and a Nb—Ba composite calcined powder.

Examples of the Ba compound that can be used include barium oxide, barium carbonate, barium oxalate, barium acetate, barium nitrate, barium titanate, and a Ba—Nb composite calcined powder.

Examples of the Ti compound that can be used include titanium oxide and barium titanate.

Examples of a desirable raw material powder combination for forming the piezoelectric material of the present disclosure include four types including sodium niobate ($NaNbO_3$) calcined powder, barium titanate ($BaTiO_3$) calcined powder, a Ba—Nb composite calcined powder obtaining by mixing and calcining barium carbonate and niobium oxide, and manganese oxide powder (for example, $Mn_3O_4$). With these raw material powder combinations, crystallization proceeds at a relatively low temperature, for example, 1300° C. or less, and the effect of the present disclosure, which is a high Curie temperature, is easily obtained. The raw material mixed powder is desirably used for forming after calcination at a maximum temperature of 800° C. or more to 1000° C. or less.

Examples of a method for forming the raw material mixed powder include uniaxial pressing, cold isostatic pressing, warm isostatic pressing, cast molding, and extrusion molding. When the compact is produced, granulated powder is desirably used. When the compact using the granulated powder is sintered, there is an advantage that the distribution of crystal grain sizes of the sintered body tends to be uniform.

A method of granulating the raw material powder of the piezoelectric material is not particularly limited, but the most desirable granulation method is a spray drying method from the viewpoint of uniformizing the particle diam of the granulated powder.

Examples of a binder that can be used during granulating include polyvinyl alcohol (PVA), polyvinyl butyral (PVB), and acrylic resins. The amount of the binder to be added is desirably 1 to 10 parts by weight with respect to the raw material powder of the piezoelectric material, and more desirably 2 to 7 parts by weight from the viewpoint of increasing the density of the compact.

A method for sintering the compact is not particularly limited.

Examples of the sintering method include sintering by an electric furnace, sintering by a gas furnace, an electric heating method, a microwave sintering method, a millimeter-wave sintering method, and hot isostatic pressing (HIP). Sintering by an electric furnace and a gas furnace may be performed in a continuous furnace or a batch furnace.

The sintering temperature in the sintering method is not particularly limited, but is desirably a temperature at which compounds react to sufficiently grow a crystal. The sintering temperature is desirably 1100° C. or more to 1400° C. or less, and more desirably 1200° C. or more to 1300° C. or less. A piezoelectric material sintered in the above temperature range exhibits good insulation and piezoelectric constant. In order to stabilize the characteristics of the piezoelectric material obtained by the sintering process with good reproducibility, the sintering process may be performed at a constant sintering temperature in the above temperature range for 1 hour or longer to 48 hours or shorter, and more desirably 2 hours or longer to 24 hours or shorter. In addition, a sintering method such as a two-step sintering method may be used, but a method without a rapid temperature change is desirable in consideration of productivity.

The piezoelectric material obtained by the sintering process is polished into a desired shape according to the application.

After the polishing process, a heat treatment is desirably performed at a temperature equal to or higher than the Curie temperature. Mechanical polishing causes the generation of residual stress in the piezoelectric material. However, by performing the heat treatment at a temperature equal to or higher than the Curie temperature, the residual stress is relaxed, and the piezoelectric characteristics of the piezoelectric material are further improved. A specific time of the heat treatment is not specifically limited, and for example, a heat treatment of holding a temperature of 300° C. or more to 500° C. or less for 1 hour or longer to 24 hours or shorter is desirable.

The average grain size of the crystals forming the piezoelectric material of the present disclosure is desirably 0.2 μm or more to 50 μm or less from the viewpoint of achieving both piezoelectricity and processing strength. By causing the average grain size to be within the above grain size range, sufficient mechanical strength during cutting and polishing can be obtained while securing sufficient piezoelectricity. A more desirable range of the average grain size is 0.3 μm or more to 20 μm or less. In this specification, the average grain size means an average equivalent circle diameter. The equivalent circle diameter represents a "projected area equivalent circle diameter" generally referred to in a microscopic observation method, and refers to the diameter of a perfect circle having the same area as the projected area of the crystal grain.

Although the present disclosure relates to a piezoelectric material, the material may be in any form such as a powder other than ceramics, a single crystal, a film, or a slurry.

In a case where the piezoelectric material of the present disclosure is used as a film formed on a substrate, the thickness of the piezoelectric material is desirably 200 nm or more to 10 μm or less, and more desirably 300 nm or more to 3 μm or less. This is because a sufficient electromechanical conversion function as a piezoelectric element can be obtained by causing the film thickness of the piezoelectric material to be 200 nm or more to 10 μm or less.

In a case of laminating the films, the lamination method is not particularly limited. Examples thereof include a chemical solution deposition method (CSD method), a sol-gel method, a metalorganic chemical vapor deposition method (MOCVD method), a sputtering method, a pulsed laser deposition method (PLD method), a hydrothermal synthesis method, and an aerosol deposition method (AD method). Among these, the most desirable lamination method is a chemical solution deposition method or a sputtering method. The chemical solution deposition method or sputtering method can easily increase the film formation area. The substrate used for the piezoelectric material of the present disclosure is desirably a single crystal substrate cut and polished at the (001) plane, (110) plane, or (111) plane. By using a single crystal substrate cut and polished at a specific crystal plane, a piezoelectric material film provided on the surface of the substrate can be strongly oriented in the same direction.

(Piezoelectric Element)

Next, the piezoelectric element of the present disclosure will be described.

FIG. 1 is a schematic perspective view illustrating an embodiment of the piezoelectric element of the present disclosure. The piezoelectric element according to the present disclosure is a piezoelectric element having at least a first electrode 1, a piezoelectric material portion 2, and a second electrode 3, and is characterized in that a piezoelectric material forming the piezoelectric material portion 2 is the piezoelectric material of the present disclosure.

The piezoelectric characteristics of the piezoelectric material according to the present disclosure can be evaluated by employing a piezoelectric element having at least the first electrode 1 and the second electrode 3. The first electrode 1 and the second electrode 3 are made of a conductive layer having a thickness of about 5 nm to 10 μm. The material is not particularly limited as long as the material is usually used for piezoelectric elements. Examples thereof include metals such as Ti, Pt, Ta, Ir, Sr, In, Sn, Au, Al, Fe, Cr, Ni, Pd, Ag, and Cu, and compounds thereof.

The first electrode 1 and the second electrode 3 may be made of one thereof, or may be a laminate of two or more thereof. The first electrode 1 and the second electrode 3 may be made of different materials.

A method of manufacturing the first electrode 1 and the second electrode 3 is not limited, and the electrodes may be formed by baking a metal paste, or using sputtering or a vapor deposition method. The first electrode 1 and the second electrode 3 may both be patterned into a desired shape and used.

(Polarization)

The piezoelectric element more desirably has polarization axes aligned in a certain direction. When the polarization axes are aligned in a certain direction, the piezoelectric constant of the piezoelectric element increases.

A polarization method of the piezoelectric element is not particularly limited. The polarization treatment may be performed in the air or in silicone oil. The temperature at which the polarization is performed is desirably 60° C. to 150° C., but the optimum conditions are slightly different depending on the composition of the piezoelectric material forming the piezoelectric element. An electric field applied to perform the polarization treatment is desirably 800 V/mm to 8.0 kV/mm.

(P-E Hysteresis Measurement)

A piezoelectric material layer of the piezoelectric element of the present disclosure has ferroelectric characteristics and thus has polarization-electric field hysteresis characteristics. The polarization-electric field hysteresis characteristics mean having a hysteresis effect in the relationship between an AC electric field applied to a ferroelectric and the amount of polarization generated by the ferroelectric. Due to this hysteresis effect, even when the external electric field is zero, the piezoelectric material layer has a positive or negative polarization value, and this polarization value is referred to as residual polarization±Pr. Similarly, the electric field in which the amount of polarization is 0 is also divided into two, and the magnitudes of these electric fields are called coercive electric field±Ec.

The polarization-electric field hysteresis characteristics are generally obtained by conversion from a charge amount measured while applying a triangular wave voltage to a pair of opposing electrodes of a piezoelectric element, and can be easily measured by a commercially available apparatus (for example, FCE (trade name) manufactured by TOYO Corporation).

In the piezoelectric element of the present disclosure, the coercive electric fields at two coercive electric field points in the hysteresis characteristics when the applied electric field applied to the piezoelectric material portion 2 is swept from −20 kV/cm to 20 kV/cm are referred to as Ec1 and Ec2, the difference between |Ec1| and |Ec2| is desirably 1.0 kV/cm or more. As described above, in the piezoelectric material of the present disclosure, by dissolving an appropriate amount of the $Ba_{0.5\square_{0.5}}NbO_3$ metal oxide in NN-BT as a solid solution, the tetragonality (lattice strain) of the perovskite-type metal oxide is increased, and the chemical composition is designed with the intention of increasing the Curie temperature and the piezoelectric constant. However, when the defect site "□" is present in any site in the crystal, the defect site "□" becomes a factor that inhibits the reversal of the polarization with respect to an external electric field, so that |Ec1| and |Ec2| are not equal to each other. This phenomenon can be observed by measuring the polarization-electric field hysteresis characteristics.

Among the piezoelectric elements using the piezoelectric material of the present disclosure, those having a difference between |Ec1| and |Ec2| of 1.0 kV/cm or more, more desirably those having a difference of 2.0 kV/cm or more are desirable because the barrier of polarization reversal to external stimuli is increased and the mechanical quality factor of the piezoelectric material and the piezoelectric element is increased to, for example, 200 or more.

(Multilayered Piezoelectric Element)

Next, an embodiment of a multilayered piezoelectric element of the present disclosure will be described.

Unlike the piezoelectric element according to the above-described embodiment, the multilayered piezoelectric element according to the present embodiment includes at least one internal electrode in the piezoelectric material portion, and has a multilayered structure in which a piezoelectric material layer made of the piezoelectric material and at least one internal electrode layered are alternately stacked.

Figure 2A:
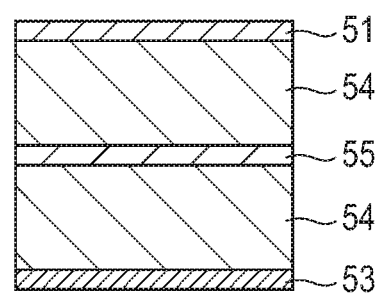
FIG. 2A is a schematic sectional view of a multilayered piezoelectric element, illustrating an embodiment of the present disclosure.
Figure 2B:
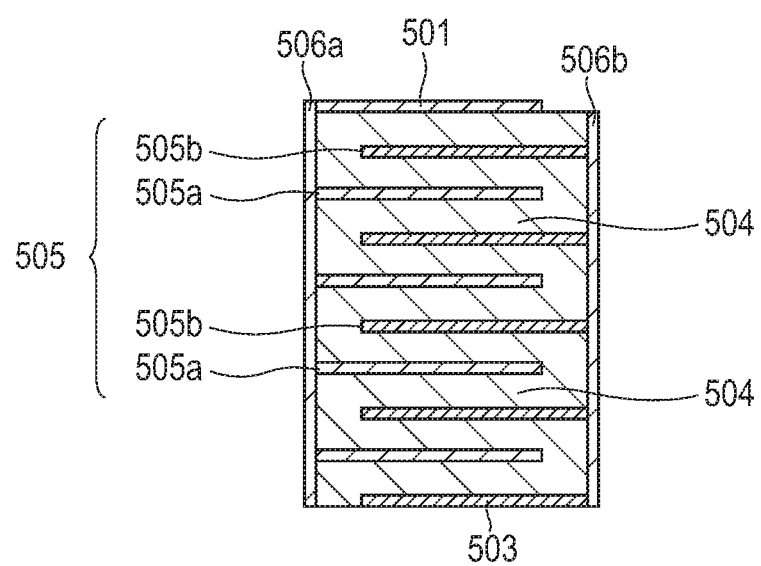
FIG. 2B is a schematic sectional view of a multilayered piezoelectric element, illustrating an embodiment of the present disclosure.

FIGS. 2A and 2B are schematic sectional views illustrating the present embodiment. The multilayered piezoelectric element according to the present disclosure is a multilayered piezoelectric element formed by piezoelectric material layers 54 and 504 and electrode layers including internal electrodes 55 and 505, which are alternately stacked, and the piezoelectric material layers 54 and 504 are made of the above-described piezoelectric material. The electrode layers may include external electrodes such as first electrodes 51 and 501 and second electrodes 53 and 503 in addition to the internal electrodes 55 and 505.

FIG. 2A illustrates the configuration of the multilayered piezoelectric element of the present disclosure in which two piezoelectric material layers 54 and one internal electrode 55 are alternately stacked, and the multilayered structure is sandwiched between the first electrode 51 and the second electrode 53. As illustrated in FIG. 2B, the number of piezoelectric material layers and internal electrodes may be increased, and the number of layers is not limited. In the multilayered piezoelectric element illustrated in FIG. 2B, nine piezoelectric material layers 504 and eight internal electrodes 505 (505a or 505b) are alternately stacked. The multilayered structure has a configuration in which the piezoelectric material layer 504 is sandwiched between the first electrode 501 and the second electrode 503, and includes an external electrode 506a and an external electrode 506b for short-circuiting the alternately formed internal electrodes.

The sizes and shapes of the internal electrodes 55 and 505, the external electrodes 506a and 506b, the first electrodes 51 and 501, and the second electrodes 53 and 503 are not necessarily the same as the piezoelectric material layers 54 and 504, and any one or more thereof may be divided into a plurality of pieces.

The internal electrodes 55 and 505, the external electrodes 506a and 506b, the first electrodes 51 and 501, and the second electrodes 53 and 503 are each made of a conductive layer having a thickness of about 5 nm to 10 μm. The material is not particularly limited as long as the material is usually used for piezoelectric elements. Examples thereof include metals such as Ti, Pt, Ta, Ir, Sr, In, Sn, Au, Al, Fe, Cr, Ni, Pd, Ag, and Cu, and compounds thereof. The internal electrodes 55 and 505 and the external electrodes 506a and 506b may be made of one of these materials, may be a mixture or alloy of two or more thereof, or may be a laminate of two or more of these materials. The plurality of electrodes may be made of different materials.

In the multilayered piezoelectric element using the piezoelectric material of the present disclosure, the internal electrode 55 and 505 contains Ag and Pd, and a weight ratio M1/M2 of an Ag content weight M1 and a Pd content weight M2 is desirably $1.5 \leq M1/M2 \leq 9.0$. When the weight ratio M1/M2 is smaller than 1.5, although the heat resistance of the internal electrode is high, the electrode cost increases due to an increase in the Pd component, which is not desirable. On the other hand, when the weight ratio M1/M2 is larger than 9.0, the heat resistance temperature of the internal electrode becomes insufficient, and thus the internal electrode is formed in an island shape and becomes non-uniform on a plane, which is not desirable. From the viewpoint of maintaining heat resistance and preventing an increase in cost, more desirably $2.0 \leq M1/M2 \leq 5.0$ is satisfied.

From the viewpoint that the electrode material is inexpensive, the internal electrode 55 and 505 desirably contains at least one of Ni and Cu. In a case of using at least one of Ni and Cu as the material of the internal electrode 55 and 505, the multilayered piezoelectric element of the present disclosure is desirably baked in a reducing atmosphere.

As illustrated in FIG. 2B, the plurality of electrodes including the internal electrode 505 may be short-circuited with each other for the purpose of aligning the phases of drive voltages. For example, the internal electrode 505a and the first electrode 501 may be short-circuited by the external electrode 506a. The internal electrode 505b and the second electrode 503 may be short-circuited by the external electrode 506b. The internal electrodes 505a and the internal electrodes 505b may be alternately arranged. Moreover, the form of the short circuit between the electrodes is not limited. An electrode or wiring for short-circuiting may be provided on the side surface of the multilayered piezoelectric element. Alternatively, a through-hole penetrating the piezoelectric material layer 504 may be provided, and a conductive material may be provided inside thereof to short-circuit the electrodes.

(Method of Manufacturing Multilayered Piezoelectric Element)

A method of manufacturing the multilayered piezoelectric element according to the present disclosure is not particularly limited, but the manufacturing method is exemplified below. First, a step (A) of obtaining a slurry by dispersing metal compound powder containing at least Mn, Na, Nb, Ba, and Ti, and a step (B) of obtaining a compact by placing the slurry on a base material are performed. Thereafter, a step (C) of forming electrodes on the compact and a step (D) of sintering the compact on which the electrodes are formed to obtain a multilayered piezoelectric element are performed.

The metal compound that can be used in the step (A) is as described above as an example of the raw material powder. Examples of a particularly desirable raw material powder combination include four types including sodium niobate ($NaNbO_3$) calcined powder, barium titanate ($BaTiO_3$) calcined powder, a Ba—Nb composite calcined powder obtaining by mixing and calcining barium carbonate and niobium oxide, and manganese oxide powder (for example, $Mn_3O_4$). When this raw material powder combination is used, crystallization proceeds at a relatively low temperature, for example, 1300° C. or less, and the effect of the present disclosure, which is a high Curie temperature, is easily obtained. More desirably, the metal oxide powder is calcined at a maximum temperature of 800° C. or more to 1000° C. or less and then formed into a slurry.

A method of producing the slurry in the step (A) is exemplified. To the metal compound powder, a solvent having a weight of 1.6 to 1.7 times the weight thereof is added and mixed. As the solvent, for example, toluene, ethanol, a mixed solvent of toluene and ethanol, n-butyl acetate, or water can be used. After mixing for 24 hours in a ball mill, a small amount of binder and plasticizer are added.

Examples of the binder include polyvinyl alcohol (PVA), polyvinyl butyral (PVB), and acrylic resins. Examples of the plasticizer include dioctyl sebacate, dioctyl phthalate, and dibutyl phthalate. In a case of using dibutyl phthalate as the plasticizer, an equal weight to the binder is weighed. Then, the ball milling is performed again overnight. The amount of the solvent and binder is adjusted so that the viscosity of the slurry becomes 300 to 500 mPa·s.

The compact in the step (B) is a sheet-shaped mixture formed of the metal compound powder, the binder, and the plasticizer. As a method of obtaining the compact in the step (B), for example, there is sheet forming. As the sheet forming, for example, a doctor blade method can be used. The doctor blade method is a method of forming a sheet-shaped compact by applying the slurry onto the base material using a doctor blade and drying the slurry.

As the base material, for example, a PET film can be used. For example, the surface of the PET film on which the slurry is placed is desirably subjected to fluorine coating because the compact can be easily peeled off. Drying may be natural drying or hot air drying. The thickness of the compact is not particularly limited and can be adjusted according to the thickness of the multilayered piezoelectric element. The thickness of the compact can be increased, for example, by increasing the viscosity of the slurry.

A method of manufacturing the electrodes in the step (C), that is, the internal electrode 505 and the external electrodes 506a and 506b is not limited, and the electrode may be formed by baking a metal paste, or formed by sputtering, a vapor deposition method, or a printing method. For the purpose of reducing the drive voltage, the layer thickness and pitch interval of the piezoelectric material layers 504 may be reduced. In this case, after forming a multilayered body including a precursor of the piezoelectric material layer 504 and the internal electrodes 505*a* and 505*b*, a process of simultaneously baking the multilayered body is selected. In this case, a material for the internal electrode that does not cause a shape change or degradation of conductivity due to a temperature necessary for sintering the piezoelectric material layer 504 is required. Metals having a lower melting point and being less expensive than Pt, such as Ag, Pd, Au, Cu, and Ni, and alloys thereof can be used for the internal electrodes 505*a* and 505*b* and the external electrodes 506*a* and 506*b*. However, the external electrodes 506*a* and 506*b* may be provided after the multilayered body is baked. In that case, in addition to Ag, Pd, Cu, and Ni, Al or a carbon-based electrode material can be used.

A screen printing method is desirable as a method of forming the electrodes. The screen printing method is a method of applying a metal paste using a spatula after a screen plate is placed on a compact placed on a base material. A screen mesh is formed at least partially on the screen plate. Therefore, the metal paste in the portion where the screen mesh is formed is applied onto the compact. It is desirable that a pattern is formed in the screen mesh in the screen plate. By transferring the pattern to the compact using the metal paste, the electrodes can be patterned on the compact.

After the electrodes are formed in the step (C) and peeled off from the base material, one or a plurality of the formed bodies are stacked and pressure-bonded. Examples of a pressure bonding method include uniaxial pressing, cold isostatic pressing, and warm isostatic pressing. Warm isostatic pressing is desirable because pressure can be applied isotropically and uniformly. Heating to near the glass transition temperature of the binder during pressure bonding is desirable because better pressure bonding can be achieved. A plurality of the formed bodies can be stacked and pressure-bonded until a desired thickness is reached. For example, 5 to 100 layers of the formed bodies are stacked, and thereafter subjected to thermocompression bonding at 50° C. to 80° C. and a pressure of 10 to 60 MPa in a laminating direction for 10 seconds to 10 minutes, whereby the formed bodies can be multilayered. Moreover, by attaching alignment marks to the electrodes, the plurality of formed bodies can be aligned and stacked with good accuracy. As a matter of course, stacking can also be performed with good accuracy by providing through-holes for positioning in the formed bodies.

The sintering temperature of the compact in the step (D) is not particularly limited, and is desirably a temperature at which compounds react to sufficiently grow a crystal. A desirable sintering temperature is 1100° C. or more to 1400° C. or less, and more desirably 1200° C. or more to 1300° C. or less from the viewpoint of causing the grain size of the ceramic to be in a range of 0.2 μm to 50 μm. The multilayered piezoelectric element sintered in the above temperature range exhibits good piezoelectric performance.

However, when a material primarily containing Ni is used for the electrodes in the step (C), the step (D) is desirably performed in a furnace capable of atmospheric baking. After burning and removing the binder at a temperature of 200° C. to 600° C. in the air atmosphere, the atmosphere is changed to a reducing atmosphere for sintering at a temperature of 1200° C. to 1550° C. Here, the reducing atmosphere refers to an atmosphere primarily containing a mixed gas of hydrogen ($H_2$) and nitrogen ($N_2$). The volume ratio of hydrogen and nitrogen is desirably in a range of $H_2:N_2=1:99$ to $H_2:N_2=10:90$. The mixed gas may contain oxygen. The oxygen concentration is $10^{-12}$ Pa or more to $10^{-4}$ Pa or less. The oxygen concentration is more desirably $10^{-8}$ Pa or more to $10^{-5}$ Pa or less. The oxygen concentration can be measured with a zirconia oxygen analyzer. By using the Ni electrode, the multilayered piezoelectric element of the present disclosure can be manufactured at low costs. It is desirable that after baking in a reducing atmosphere, the temperature is lowered to 600° C., and the atmosphere is substituted with an air atmosphere (oxidizing atmosphere) to perform an oxidation treatment. After taking out the resultant from the baking furnace, a conductive paste is applied to the side surface of the element body where the end portion of the internal electrode is exposed and dried to form the external electrode.

(Electronic Equipment)

An electronic equipment according to the present disclosure includes the piezoelectric element according to the present disclosure.

Figure 3A:
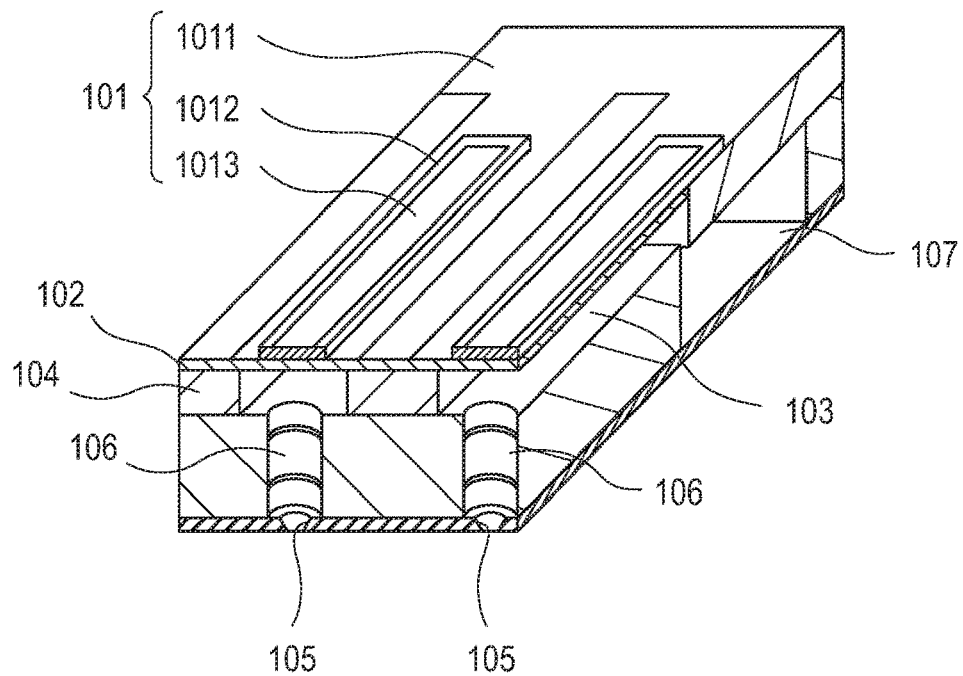
FIG. 3A is a schematic perspective view of an electronic equipment, illustrating an embodiment of the present disclosure.
Figure 3B:
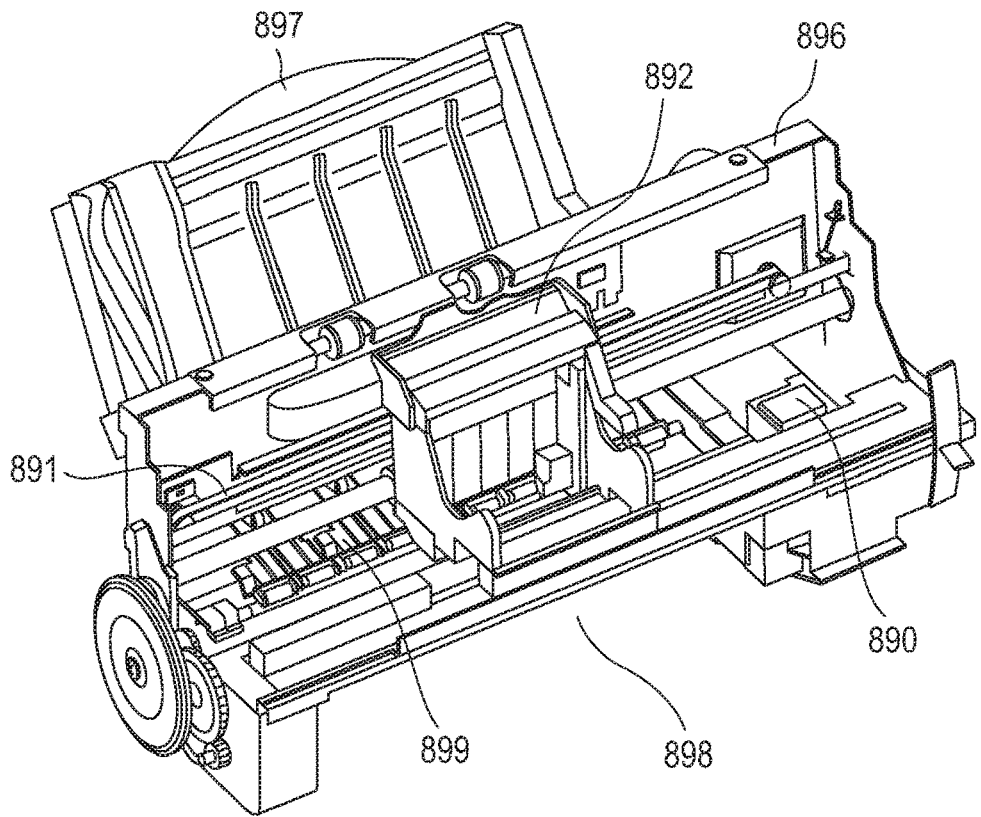
FIG. 3B is a schematic perspective view of an electronic equipment, illustrating an embodiment of the present disclosure.

Example 1 of Electronic Equipment: Liquid Ejection Head, Liquid Ejecting Apparatus FIGS. 3A and 3B are schematic perspective views schematically illustrating the configurations of a liquid ejection head (A) provided with the piezoelectric element of the present disclosure and a liquid ejecting apparatus (B) using the liquid ejection head as an example of the electronic equipment of the present disclosure. The liquid ejection head includes at least a liquid chamber provided with a vibrating portion in which the piezoelectric element or the multilayered piezoelectric element is disposed, and an ejection orifice communicating with the liquid chamber. The liquid ejecting apparatus includes a placement portion for a transfer object, and the liquid ejection head. However, the shapes and arrangement of members are not limited to the examples of FIGS. 3A and 3B.

As illustrated in FIG. 3A, the liquid ejection head which is the electronic equipment of the present disclosure includes a piezoelectric element 101 of the present disclosure. The piezoelectric element 101 includes at least a first electrode 1011, a piezoelectric material 1012, and a second electrode 1013. The piezoelectric material 1012 and the second electrode 1013 may be patterned for the purpose of increasing the ejection force of the liquid ejection head.

The liquid ejection head has ejection ports 105, individual liquid chambers 103, communication holes 106 that connects the individual liquid chambers 103 and the ejection ports 105, liquid chamber partition walls 104, a common liquid chamber 107, a diaphragm 102, and the piezoelectric elements 101. In general, the piezoelectric material 1012 has a shape along the shape of the individual liquid chamber 103.

When an electrical signal is input to the liquid ejection head which is an example of the electronic equipment of the present disclosure for an operation, the diaphragm 102 vibrates up and down due to deformation of the piezoelectric element 101, and pressure is applied to a liquid stored in the individual liquid chamber 103. As a result, the liquid is ejected from the ejection orifice 105. The liquid ejection head can be assembled in a printer that performs printing on various media or can be used for manufacturing an electronic device.

Next, the liquid ejecting apparatus using the liquid ejection head will be described.

This liquid ejecting apparatus is also an example of the electronic equipment of the present disclosure. FIG. 3B illustrates a liquid ejecting apparatus as an ink jet recording apparatus.

In the liquid ejecting apparatus in FIG. 3B, each mechanism is assembled in an exterior portion 896. An automatic feeding unit 897 has a function of automatically feeding a recording sheet as the transfer object into the apparatus main body. The recording sheet sent from the automatic feeding unit 897 is guided to a predetermined recording position (no reference numeral in the figure) by the conveyance unit 899, and after a recording operation, is again guided from the recording position to a discharge unit 898 by the conveyance unit 899. The conveyance unit 899 is the placement portion for the transfer object. The liquid ejecting apparatus further includes a recording unit 891 that performs recording on the recording sheet conveyed to the recording position, and a recovery unit 890 that performs recovery processing on the recording unit 891. The recording unit 891 includes a carriage 892 that accommodates the liquid ejection head and reciprocally moves on a rail.

In this liquid ejecting apparatus, the carriage 892 moves the liquid ejection head in accordance with an instruction from an external computer, and ink is discharged from the ejection orifice 105 of the liquid ejection head in response to voltage application to the piezoelectric element of the present disclosure, whereby printing is performed.

Although the above example is exemplified by a printer, the liquid ejecting apparatus of the present disclosure can be used as a printing apparatus such as an ink jet recording apparatus such as a facsimile, a multi-function machine, and a copying machine, as well as an industrial liquid ejecting apparatus and a drawing apparatus for an object. Also, a user can select a desired transfer object for application.

Example 2 of Electronic Equipment: Vibration Wave Motor, Optical Apparatus

FIGS. 4A to 4E are schematic views schematically illustrating the configurations of a vibration wave motor provided with the piezoelectric element of the present disclosure and an optical apparatus using the vibration wave motor, as an example of the electronic equipment of the present disclosure. The vibration wave motor includes at least a vibrating body in which the piezoelectric element or the multilayered piezoelectric element is disposed, and a moving body in contact with the vibrating body. The optical apparatus includes the vibration wave motor in a drive unit. However, the shapes and arrangement of members are not limited to the examples in FIGS. 4A to 4E.

Figure 4A:
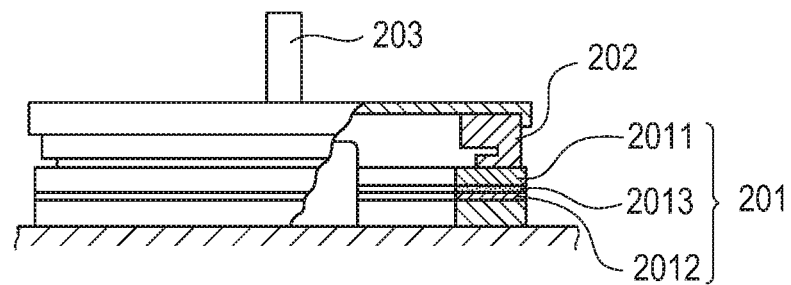
FIG. 4A is a schematic partial sectional view of an electronic equipment, illustrating an embodiment of the present disclosure.

FIG. 4A illustrates a vibration wave motor in which the piezoelectric element of the present disclosure is formed of a single plate. The vibration wave motor includes a vibrating body 201, a moving body 202 (also referred to as a rotor) that is in contact with a sliding surface of the vibrating body 201 with a pressurizing force applied by a pressuring spring (not illustrated), and an output shaft 203 provided integrally with the moving body 202. The vibrating body 201 includes a metal elastic ring 2011, a piezoelectric element 2012 according to the present disclosure, and an organic adhesive 2013 (for example, epoxy or cyanoacrylate-based) that bonds the piezoelectric element 2012 to the elastic ring 2011.

When two-phase alternating voltages having different phases by an odd multiple of $\pi/2$ is applied to the piezoelectric element 2012, the vibrating body 201 generates flexural traveling waves, and each point on the sliding surface of the vibrating body 201 performs an elliptical motion. The rotor 202 is rotated in the direction opposite to the flexural traveling waves by receiving a frictional force from the vibrating body 201. A driven body (not illustrated) is joined to the output shaft 203 and is driven by the rotational force of the rotor 202.

Figure 4B:
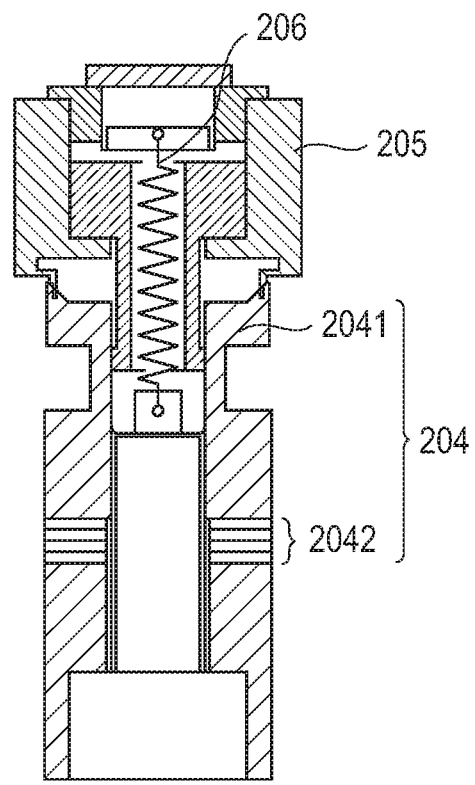
FIG. 4B is a schematic sectional view of an electronic equipment, illustrating an embodiment of the present disclosure.

Next, FIG. 4B illustrates an example of a vibration wave motor including a piezoelectric element having a multilayered structure (multilayered piezoelectric element). A vibrating body 204 includes a multilayered piezoelectric element 2042 sandwiched in a cylindrical metal elastic body 2041. The multilayered piezoelectric element 2042 is the above-described multilayered element, and has a first electrode and a second electrode on the outer surfaces of the laminate, and an internal electrode on the inner surface of the laminate. The metal elastic body 2041 sandwiches and fixes the multilayered piezoelectric element 2042 with a bolt to form the vibrating body 204.

By applying alternating voltages having different phases to the multilayered piezoelectric element 2042, the vibrating body 204 excites two vibrations orthogonal to each other. These two vibrations are synthesized to form a circular vibration for driving the tip end portion of the vibrating body 204. A constricted circumferential groove is formed in the upper portion of the vibrating body 204 to increase the vibration displacement for driving.

A moving body 205 (also referred to as a rotor) is brought into pressure contact with the vibrating body 204 by a spring 206 for pressurizing to obtain a frictional force for driving. The moving body 205 is rotatably supported by a bearing.

Next, an example of an optical apparatus using the vibration wave motor will be described.

This optical apparatus is also an example of the electronic equipment of the present disclosure.

Figure 4C:
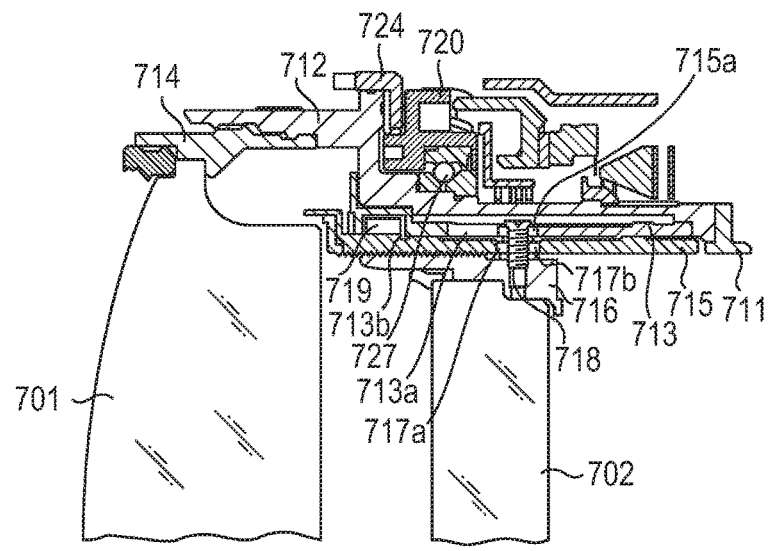
FIG. 4C is a schematic sectional view of an electronic equipment, illustrating an embodiment of the present disclosure.
Figure 4D:
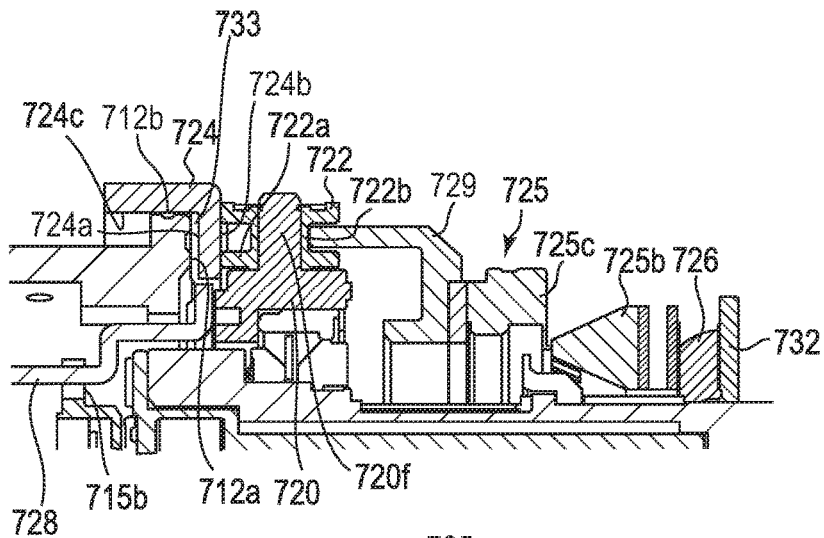
FIG. 4D is a schematic sectional view and a schematic perspective view of the electronic equipment, illustrating the embodiment of the present disclosure.
Figure 4E:
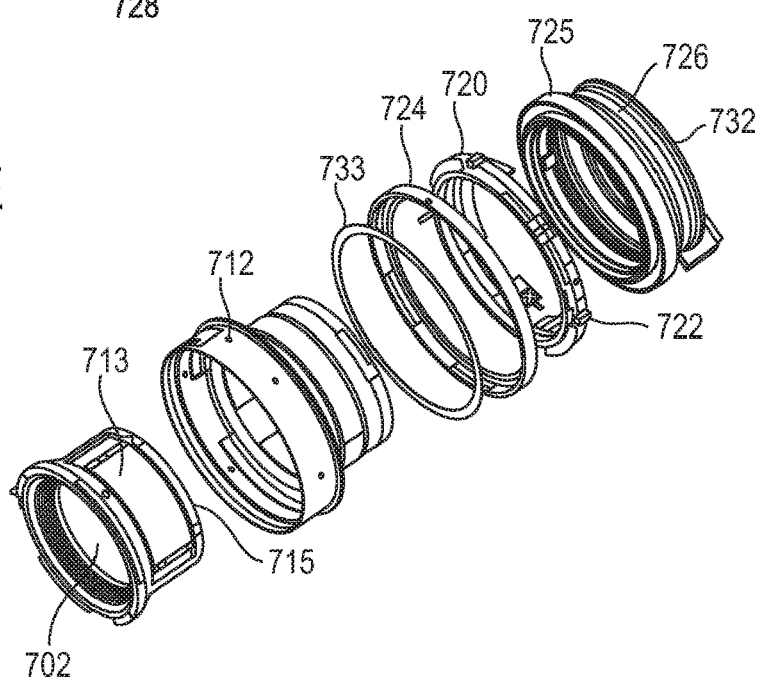
FIG. 4E is a schematic perspective view of the electronic equipment, illustrating the embodiment of the present disclosure.

FIGS. 4C, 4D, and 4E illustrate an interchangeable lens barrel of a single-lens reflex camera as an example of the optical apparatus.

A fixing tube 712, a rectilinear guide tube 713, and a front group barrel 714 that holds a front group lens 701 are fixed to mount 711 attachable to and detachable from the camera. These are fixing members for the interchangeable lens barrel.

In the rectilinear guide tube 713, a rectilinear guide groove 713a for a focus lens 702 is formed in an optical axis direction. Cam rollers 717a and 717b projecting radially outward are fixed to a rear group barrel 716 holding the focus lens 702 by a shaft screw 718, and the cam roller 717a is fitted in the rectilinear guide grooves 713a.

A cam ring 715 is rotatably fitted on the inner circumference of the rectilinear guide tube 713. The relative movement of the rectilinear guide tube 713 and the cam ring 715 in the optical axis direction is restricted by fitting a roller 719 fixed to the cam ring 715 in a circumferential groove 713b of the rectilinear guide tube 713. In the cam ring 715, a cam groove 715a for the focus lens 702 is formed, and the cam roller 717b is simultaneously fitted in the cam groove 715a.

On the outer circumferential side of the fixing tube 712, a rotation transmission ring 720 that is held by a ball race 727 so as to be rotatable at a fixed position relative to the fixing tube 712 is disposed. In the rotation transmission ring 720, a roller 722 is rotatably held by a shaft 720f extending radially from the rotation transmission ring 720. A large diameter portion 722a of the roller 722 is in contact with a mount-side end surface 724b of a manual focusing ring 724. A small diameter portion 722b of the roller 722 is in contact with a joining member 729. Six rollers 722 are arranged at equal intervals on the outer circumference of the rotation transmission ring 720, and each roller is configured in the same manner as described above.

A low friction sheet (washer member) 733 is disposed on the inner diameter portion of the manual focusing ring 724. This low friction sheet is sandwiched between a mount-side end surface 712a of the fixing tube 712 and a front end surface 724a of the manual focusing ring 724. In addition, the outer diameter surface of the low friction sheet 733 has a ring shape and is radially fitted with an inner diameter 724c of the manual focusing ring 724. Furthermore, the inner diameter 724c of the manual focusing ring 724 is radially fitted with an outer diameter portion 712b of the fixing tube 712. The low friction sheet 733 serves to reduce friction in the rotating ring mechanism in which the manual focusing ring 724 rotates relative to the fixing tube 712 around the optical axis.

The large diameter portion 722a of the roller 722 and the mount-side end surface 724b of the manual focusing ring are in contact with each other in a state where pressure is applied by the force of a wave washer 726 pressing the vibration wave motor 725 forward of the lens. Similarly, the small diameter portion 722b of the roller 722 and the joining member 729 are in contact with each other in a state where an appropriate pressure is applied by the force of the wave washer 726 pressing the vibration wave motor 725 forward of the lens. The movement of the wave washer 726 toward the mount is restricted by a washer 732 that is bayonet-coupled to the fixing tube 712. The spring force (biasing force) generated by the wave washer 726 is transmitted to the vibration wave motor 725 and further to the roller 722, and becomes the force of the manual focusing ring 724 pressing the mount-side end surface 712a of the fixing tube 712. That is, the manual focusing ring 724 is assembled in a state of being pressed against the mount-side end surface 712a of the fixing tube 712 via the low friction sheet 733.

Therefore, when the vibration wave motor 725 is driven by a control unit (not illustrated), a rotor 725c that is a part of the vibration wave motor is driven to rotate relative to the fixing tube 712 by the vibration generated in a stator 725b that is a part of the vibration wave motor. Since the joining member 729 is in frictional contact with the small diameter portion 722b of the roller 722, the roller 722 rotates around the center of the shaft 720f as the rotor 725c moves. When the roller 722 rotates around the shaft 720f, as a result, the rotation transmission ring 720 rotates around the optical axis.

Two focus keys 728 are attached to the rotation transmission ring 720 at positions facing each other, and the focus key 728 is fitted in a notch 715b provided at the tip end of the cam ring 715. Therefore, when the rotation transmission ring 720 rotates around the optical axis, the rotational force is transmitted to the cam ring 715 via the focus keys 728. When the cam ring 715 is rotated around the optical axis, the rear group barrel 716 whose rotation is restricted by the cam roller 717a and the rectilinear guide groove 713a advances and retreats along the cam groove 715a of the cam ring 715 by the cam roller 717b. As a result, the focus lens 702 is driven and a focusing operation is performed.

While the interchangeable lens barrel of the single-lens reflex camera has been described as the optical apparatus using the vibration wave motor has been described, the vibration wave motor can be applied to optical apparatuses having the vibration wave motor in a drive unit regardless of the type of camera, such as a compact camera or an electronic still camera.

Example 3 of Electronic Equipment: Vibration Device, Image Pickup Apparatus

FIGS. 5A to 5D are schematic perspective views schematically illustrating the configurations of a vibration device including the piezoelectric element of the present disclosure and an image pickup apparatus using the vibration device as an example of the electronic equipment of the present disclosure. The vibration device illustrated in FIGS. 5A to 5D is a dust removing apparatus that has at least a vibrating body in which the piezoelectric element of the present disclosure is disposed on a diaphragm and has a function of removing dust attached to the surface of the diaphragm. In addition, the image pickup apparatus is an image pickup apparatus having at least the dust removing apparatus and an image pickup element unit, and the diaphragm of the dust removing apparatus is provided on the light-receiving surface side of the image pickup element unit.

However, the shapes and arrangement of members are not limited to the examples of FIGS. 5A to 5D.

Figure 5A:
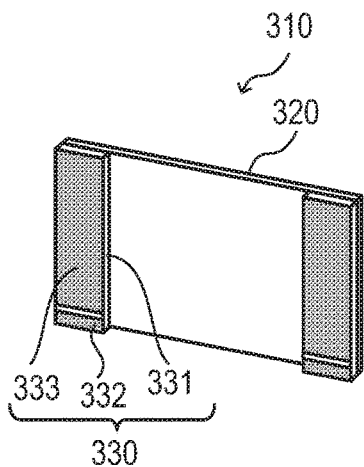
FIG. 5A is a schematic perspective view of an electronic equipment, illustrating an embodiment of the present disclosure.
Figure 5B:
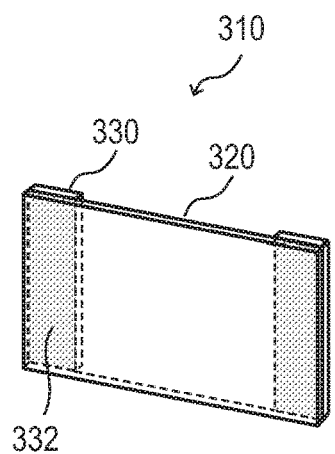
FIG. 5B is a schematic perspective view of the electronic equipment, illustrating the embodiment of the present disclosure.

FIGS. 5A and 5B are schematic perspective views illustrating an embodiment of the dust removing apparatus as the electronic equipment of the present disclosure. A dust removing apparatus 310 includes a plate-like piezoelectric element 330 and a diaphragm 320. The piezoelectric element 330 may be the multilayered piezoelectric element of the present disclosure. Although the material of the diaphragm 320 is not limited, in a case where the dust removing apparatus 310 is used for an optical device, a light-transmitting material or a light-reflecting material can be used as the diaphragm 320, and a light-transmitting portion or a light-reflecting portion of the diaphragm are the targets of dust removal.

The piezoelectric element 330 includes a piezoelectric material 331, a first electrode 332, and a second electrode 333, and the first electrode 332 and the second electrode 333 are disposed to face the plate surface of the piezoelectric material 331. In the case of a multilayered piezoelectric element, the piezoelectric material 331 has a structure in which piezoelectric material layers and internal electrodes are alternately arranged, and the internal electrodes are alternately short-circuited with the first electrode 332 or the second electrode 333, whereby drive waveforms having different phases can be provided for each layer. In the example illustrated in FIG. 5A, the first electrode 332 wraps around the side where the second electrode 333 is located.

When an alternating voltage is applied to the piezoelectric element 330 from the outside, a stress is generated between the piezoelectric element 330 and the diaphragm 320, and an out-of-plane vibration is generated in the diaphragm. The dust removing apparatus 310 is an apparatus that removes foreign matters such as dust attached to the surface of the diaphragm 320 by the out-of-plane vibration of the diaphragm 320. The out-of-plane vibration refers to an elastic vibration that displaces the diaphragm in the optical axis direction, that is, in the thickness direction of the diaphragm.

Figure 5C:
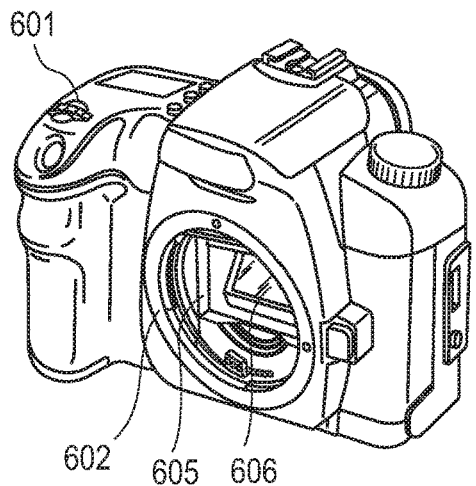
FIG. 5C is a schematic perspective view of an electronic equipment, illustrating an embodiment of the present disclosure.
Figure 5D:
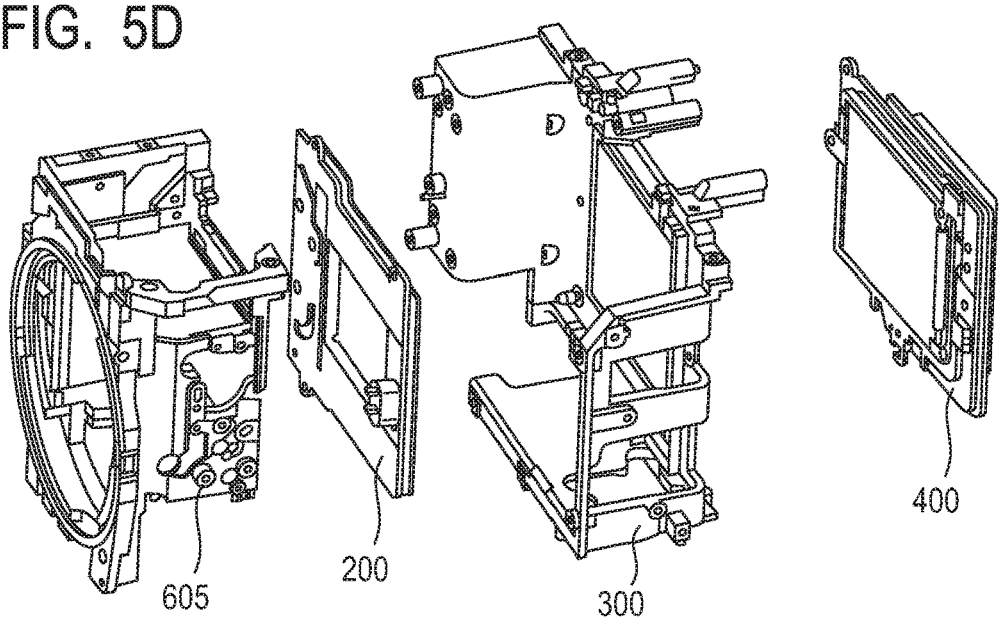
FIG. 5D is an exploded perspective view of the electronic equipment, illustrating the embodiment of the present disclosure.

Next, an image pickup apparatus using the dust removing apparatus will be described. This image pickup apparatus is also an example of the electronic equipment of the present disclosure. FIGS. 5C and 5D illustrate the image pickup apparatus as a digital single-lens reflex camera.

FIG. 5C is a front perspective view of a camera body 601 viewed from a subject side, and illustrates a state where a photographing lens unit is removed. FIG. 5D is an exploded perspective view illustrating a schematic configuration inside the camera for illustrating the structure around the dust removing apparatus and an imaging unit 400.

The camera body 601 illustrated in FIG. 5C is provided therein with a mirror box 605 to which a photographing light beam that has passed through a photographing lens is guided. A main mirror (quick return mirror) 606 is disposed in the mirror box 605. The main mirror 606 can take a state of being held at an angle of 45° with respect to the photographing optical axis so as to guide the photographing light beam to a pentamirror (not illustrated), and a state of being held at a position retracted from the photographing light beam so as to guide the photographing light beam to an imaging element (not illustrated).

In FIG. 5D, a mirror box 605 and a shutter unit 200 are arranged in this order from the subject side on the subject side of a body chassis 300 that is the skeleton of the camera body. The imaging unit 400 is disposed on the photographer side of the body chassis 300. The imaging unit 400 includes a diaphragm of a dust removing apparatus and an image pickup element unit. The diaphragm of the dust removing apparatus is sequentially provided coaxially with the light-receiving surface of the image pickup element unit. The imaging unit 400 is installed on the mounting surface of a mount portion 602 (FIG. 5C) that serves as a reference for mounting a photographing lens unit, and the imaging surface of the image pickup element unit is adjusted to be spaced a predetermined distance from the imaging lens unit and be parallel thereto.

Here, although the digital single-lens reflex camera has been described as an example of the image pickup apparatus, for example, the image pickup apparatus may be a photographing lens unit interchangeable camera such as a mirrorless digital single-lens camera that does not include the mirror box 605. In addition, among various types of image pickup apparatuses such as a photographing lens unit-interchangeable video camera, a copying machine, a facsimile, a scanner or electric and electronic equipment provided with image pickup apparatuses, particularly apparatus that require removal of dust attached to the surface of optical components can be applied.

While the liquid ejection head, the liquid ejecting apparatus, the vibration wave motor, the optical apparatus, the vibration device, and the image pickup apparatus have been described as examples of the electronic equipment of the present disclosure, the types of electronic equipments are not limited thereto. The piezoelectric element of the present disclosure is generally applicable to electronic equipments that detect electrical signals and extract energy due to the positive piezoelectric effect by extracting power from the piezoelectric element, and electronic equipments that use displacement due to the reverse piezoelectric effect by inputting power to the piezoelectric element. For example, a piezoelectric acoustic component, and a voice reproducing device, a voice recording device, a mobile phone, and an information terminal having the piezoelectric acoustic component are also included in the electronic equipment of the present disclosure.

EXAMPLES

The piezoelectric material, piezoelectric element, and electronic equipment of the present disclosure will be described more specifically with reference to the following examples, but the present disclosure is not limited to the following examples.

Example 1

A piezoelectric material of the present disclosure containing Na, Ba, Nb, and Ti and further containing Mn was manufactured.

First, Ba—Nb composite calcined powder was synthesized so as to cause the Ba component and the Nb component of the target piezoelectric material to be in a non-stoichiometric ratio.

Barium carbonate ($BaCO_3$, purity 99.9% or more) was used as the Ba raw material, and niobium oxide ($Nb_2O_5$, purity 99.9% or more) was used as the Nb raw material. Barium carbonate and niobium oxide were mixed in equimolar amounts so that the molar ratio of the Ba component and the Nb component became 1:2, and the mixture was held in an electric furnace at 900° C. in an air atmosphere for 2 hours, whereby Ba—Nb composite calcined powder was obtained. When the crystal structure of the Ba—Nb composite calcined powder was analyzed by X-ray diffraction measurement, a tungsten bronze type structure ($BaNb_2O_6$ type) was the primary phase, and a slight amount of a perovskite-type structure ($Ba_{0.5\square0.5}NbO_3$ type) was seen as a secondary phase. This Ba—Nb composite calcined powder was also used in other examples and comparative examples.

In weighing and mixing the raw materials of the piezoelectric material of Example 1, the mixing ratio of each component was as follows. That is, the molar ratio x of Ti to the total molar amount of Nb and Ti was 0.08, the molar ratio y of Na to Nb was 0.96, the molar ratio z of Ba to Ti was 1.25, that is, y×z was 1.20, the molar ratio b of Ba to the total molar amount of Na and Ba was 0.10, and the molar ratio m of Mn to the total molar amount of Nb and Ti was 0.0010.

As specific raw material powders, sodium niobate ($NaNbO_3$, purity 99.5% or more), barium titanate ($BaTiO_3$, purity 99.8% or more), the Ba—Nb composite calcined powder (converted into $Ba_{0.5\square0.5}NbO_3$ type in molar amount) and manganese oxide ($Mn_3O_4$, purity 99.9%, calculated as $MnO_{4/3}$ in molar amount) were mixed in a molar ratio of 88:8:4:0.1 and used. Mixing was performed by rotating a dry ball mill for 24 hours.

The powder obtained by mixing the raw materials was calcined by being held in an electric furnace in an air atmosphere at 900° C. for 2 hours.

The calcined powder was pulverized, and 3% by mass of a PVA binder was added to the calcined powder, followed by spray dry granulation.

The granulated powder was charged into a die and compressed to produce a disk-shaped compact. The obtained compact was baked in air at a maximum temperature of 1240° C. for 12 hours, thereby obtaining a ceramic-shaped piezoelectric material of Example 1 of the present disclosure.

A portion (1 g or more) of the piezoelectric material was pulverized, X-ray diffraction measurement was performed to specify the crystal structure by Rietveld analysis. The specimen had a substantially single perovskite-type structure, and no tungsten bronze type was detected. Furthermore, when the X-ray diffraction measurement was performed while changing the environmental temperature from room temperature to 300° C., splitting of each diffraction peak disappeared at 260° C., and a phase change to a paraelectric structure was observed. Therefore, the Curie temperature of this piezoelectric material was determined to be 260° C.

Separately, a portion (1 g or more) of the piezoelectric material was pulverized and dissolved with an acid, and the composition of the piezoelectric material was evaluated by inductively coupled plasma emission spectroscopy (ICP). It was found that the sum of Na, Ba, Nb, Ti, and Mn accounted for 99.9 mol % or more of the metal components excluding oxygen, and all the elements were contained in the piezoelectric material at substantially the same ratios as the target composition. (x=0.08, y=0.96, z=1.25, y×z=1.20, b=0.10, and m=0.0010). Moreover, Pb contained in the piezoelectric material was less than 100 ppm, and K was less than 200 ppm.

When the surface of the piezoelectric material was polished and observed with an optical microscope and the grain size was evaluated, the average equivalent circle diameter was 3.3 μm.

Furthermore, when the density of the piezoelectric material was measured by the Archimedes method, the density was 4.53 g/cm$^3$.

Next, a piezoelectric element of the present disclosure using the piezoelectric material of Example 1 was prepared.

First, the disk-shaped piezoelectric material baked in Example 1 was polished so as to have a thickness of about 0.5 mm. In order to remove stress inside the piezoelectric material and organic components on the surface of the piezoelectric material caused by the polishing, a heat treatment was performed in an air atmosphere at 400° C. for 30 minutes.

A gold (Au) electrode having a thickness of 400 nm was formed by a DC sputtering method on both the front and rear surfaces of the piezoelectric material after the heat treatment. A 30-nm thick titanium (Ti) film was formed as an adhesion layer between the electrode and the piezoelectric material.

This electrode-attached piezoelectric material was cut into a 10 mm×2.5 mm×0.5 mmt rectangular plate suitable for property evaluation to obtain the piezoelectric element of the present disclosure. The mechanical strength of the piezoelectric material of Example 1 was high enough to perform polishing and cutting without problems.

For the purpose of aligning the polarization axis of the piezoelectric element in a certain direction, a polarization treatment was performed on the piezoelectric element. Specifically, in a silicone oil bath held at 150° C., a voltage of 2.1 kV/mm was applied to the specimen for 30 minutes, and the specimen was cooled to room temperature while the voltage was applied.

The electrical resistivity of the piezoelectric element that had been subjected to the polarization treatment was evaluated using a semiconductor parameter analyzer. In order to measure the resistivity, a DC voltage of 10 V was applied between two opposing electrodes of the element at room temperature, and a leak current value after 20 seconds was obtained. When the resistivity is 1.0×10$^9$ Ω·cm or more, and more desirably 3.0×10$^{10}$ Ω·cm or more, it can be said that the piezoelectric element has sufficient insulation for practical use. The piezoelectric element of Example 1 exhibited a resistivity of 2.7×10$^{12}$ Ω·cm.

Furthermore, a change in capacitance with temperature was measured for the piezoelectric element that had been subjected to the polarization treatment using an impedance analyzer, and the Curie temperature at which the capacitance was maximized due to the phase transition was determined. The Curie temperature of the piezoelectric element of Example 1 was 260° C., which was suitable for practical use of the element. In addition, the Curie temperature specified by the X-ray diffraction measurement and the Curie temperature specified from the capacitance coincided with each other. In addition, no other phase transition (ferroelectric-ferroelectric structure phase transition) was observed in the range from room temperature to the Curie temperature, and a variation width of the capacitance with temperature in a range from room temperature to 200° C. was less than 7%.

The dielectric loss tangent at room temperature calculated from the impedance measurement was 0.87%.

Figure 7:
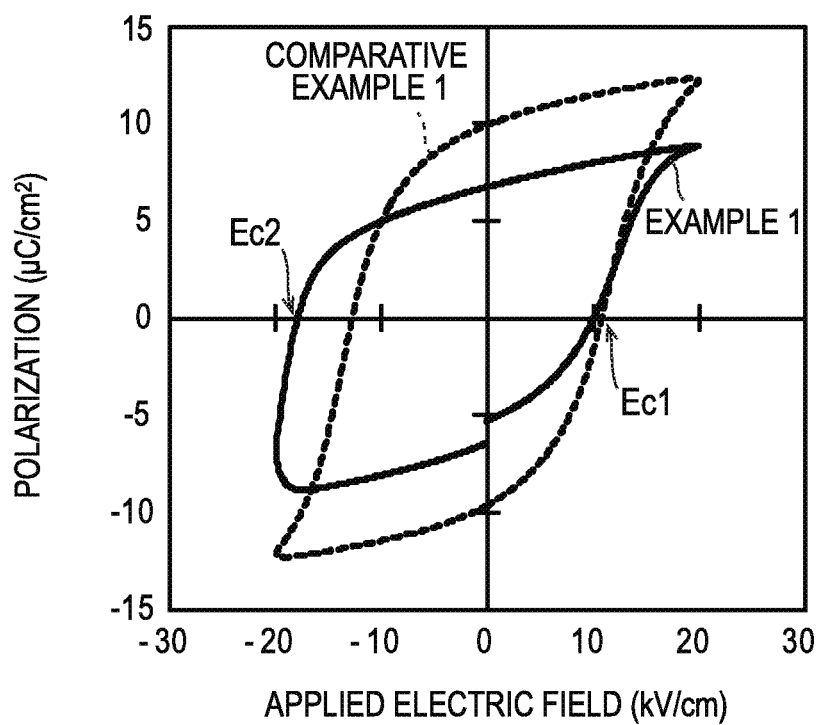
FIG. 7 is a graph illustrating polarization-electric field hysteresis characteristics of Example 1 of the present disclosure and Comparative Example 1.

In addition, the piezoelectric element that had been subjected to the polarization treatment was subjected to electric field-polarization hysteresis measurement at room temperature. Specifically, by using a commercially available ferroelectric property evaluation system (FCE-1 (trade name) manufactured by TOYO Corporation), an alternating voltage of a triangular wave was applied to the electrode portion of the piezoelectric element, and the amount of polarization was calculated from the magnitude of the generated charge. The amplitude of the voltage was set such that the magnitude of the electric field with respect to the thickness of the piezoelectric material was ±20 kV/cm. The frequency of the alternating voltage was set to 1 kHz. The measurement results are illustrated in FIG. 7. In the figure, the horizontal axis represents the magnitude of the electric field applied to the piezoelectric element, and the vertical axis represents the magnitude of polarization of the piezoelectric element. The solid line in the figure is the measurement result for the piezoelectric element of Example 1, and the broken line is the measurement result for the piezoelectric element of Comparative Example 1, which will be described later.

In the measurement, the electric field when spontaneous polarization was reversed from negative to positive was referred to as a coercive electric field Ec1, and the electric field when the spontaneous polarization was reversed from positive to negative was referred to as a coercive electric field Ec2. |Ec1| and |Ec2| became equal to each other in a case where there is no internal electric field in the piezoelectric material. However, in the case of the piezoelectric element of Example 1, since Ec1 was 10.1 kHz and Ec2 was −17.8 kHz, the difference between |Ec1| and |Ec2| was 7.7 kHz/cm.

Furthermore, the piezoelectric element that had been subjected to the polarization treatment was subjected to a resonance-antiresonance method at room temperature using an impedance analyzer, and a piezoelectric constant and a mechanical quality factor were calculated.

The piezoelectric constant |d$_{31}$| of the piezoelectric element of Example 1 at room temperature was 67.3 pm/V, and the mechanical quality factor Qm was 283 (see Table 2).

Examples 2 to 22

Next, a piezoelectric material the present disclosure containing Na, Ba, Nb, and Ti and further containing Mn was manufactured in the same manner as in Example 1 with the exception that the mixing ratio of each component in the raw material powder and the maximum temperature during baking were changed.

The mixing molar ratio of sodium niobate, barium titanate, the Ba—Nb composite calcined powder, and manganese oxide, and the maximum temperature during baking are as shown in Table 1.

A portion (1 g or more) of each of the piezoelectric materials of Examples 2 to 22 was pulverized and the crystal structure was specified. The specimens of all the examples had a substantially single perovskite-type structure, and no tungsten bronze type structure was detected.

Figure 6:
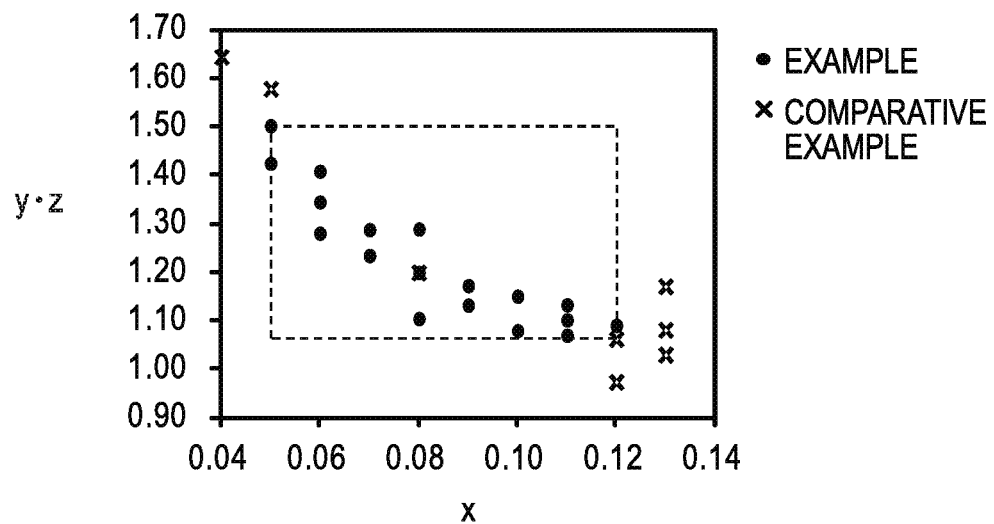
FIG. 6 is a diagram illustrating the relationship between the composition ratios of examples of the present disclosure and comparative examples.

The compositions (x, y, z, y×z, b, and m) of the piezoelectric materials of Examples 2 to 22 by the ICP method are as shown in Table 1. The sum of Na, Ba, Nb, Ti, and Mn accounted for 99.9 mol % or more of the metal components excluding oxygen, Pb contained in the piezoelectric material was less than 100 ppm, and K was less than 200 ppm. The relationship between the x value and the y×z value (multiplier of y and z, expressed as y·z as necessary) in all the examples is illustrated in FIG. 6. In FIG. 6, the • marks in the rectangular range surrounded by the solid line mean the examples of the present disclosure, and the × marks mean the comparative examples described later. Furthermore, the rectangular range surrounded by the chain line in FIG. 6 indicates the composition range of the present disclosure.

When the surface of the piezoelectric materials of Examples 2 to 22 was observed with an optical microscope and a scanning electron microscope (SEM) in a state after being baked and the grain size was evaluated, all the average equivalent circle diameters were in a range of 0.2 μm or more to 50 μm or less.

When the density of the piezoelectric materials of Examples 2 to 22 was measured by the Archimedes method, the density was in a range of 4.47 g/cm$^3$ (Example 17) to 4.55 g/cm$^3$ (Example 16).

Next, in the same manner as in Example 1, piezoelectric elements of the present disclosure using the piezoelectric materials of Examples 2 to 22 were prepared. The shape of the piezoelectric element for evaluation was a rectangular plate shape of 10 mm×2.5 mm×0.5 mm. The mechanical strength of the piezoelectric materials of Examples 2 to 22 was high enough to perform polishing and cutting without problems.

Next, in the same manner as in Example 1, the obtained piezoelectric element was subjected to a polarization treatment.

The electrical resistivity of the piezoelectric element that had been subjected to the polarization treatment was 7.6× $10^{10}$ Ω·cm at the minimum in Example 17, and the other examples all showed a resistivity of 1.0×$10^{11}$ Ω·cm or more.

The Curie temperatures obtained in the same manner as in Example 1 are as shown in Table 2. The Curie temperatures of all the examples were 192° C. or more. Moreover, except for Example 14, the Curie temperatures of all the examples were 200° C. or more. Furthermore, except for Examples 6 and 7, the Curie temperature of all the examples was 235° C. or more. In the piezoelectric elements of these examples having a Curie temperature of 235° C. or more, no other phase transition (ferroelectric-ferroelectric structure phase transition) was observed in the range from room temperature to the Curie temperature, and a variation width of the capacitance with temperature in a range from room temperature to 200° C. was less than 7%.

As shown in Table 2, the dielectric loss tangent at room temperature of the piezoelectric element of each of the examples calculated from impedance measurement was less than 2%, and was less than 1% except for Examples 17 and 22.

Table 2 shows the difference between |Ec1| and |Ec2| obtained in the same manner as in Example 1 for the piezoelectric element that had been subjected to the polarization treatment. In any of the examples, the difference between |Ec1| and |Ec2| was 1.0 kV/cm or more.

Table 2 shows the piezoelectric constants and mechanical quality factors obtained in the same manner as in Example 1 for each of the piezoelectric elements in Examples 2 to 22 that had been subjected to the polarization treatment. The piezoelectric constants |$d_{31}$| at room temperature of the piezoelectric elements of all the examples were 60 pm/V or more, and the mechanical quality factors Qm were 200 or more.

TABLE 1

| Example No. | NaNbO$_3$ raw material (mol ratio) | BaTiO$_3$ raw material (mol ratio) | Ba—Nb composite calcined powder (mol ratio) | MnO$_{4/3}$ raw material (mol ratio) | Sintering temperature (° C.) | x | y | z | y × z | b | m |
|---|---|---|---|---|---|---|---|---|---|---|---|
| Example 1 | 88.0 | 8.0 | 4.0 | 0.10 | 1240 | 0.08 | 0.96 | 1.25 | 1.20 | 0.10 | 0.0010 |
| Example 2 | 90.0 | 6.0 | 4.0 | 0.10 | 1250 | 0.06 | 0.96 | 1.33 | 1.28 | 0.08 | 0.0010 |
| Example 3 | 89.0 | 7.0 | 4.0 | 0.10 | 1240 | 0.07 | 0.96 | 1.29 | 1.23 | 0.09 | 0.0010 |
| Example 4 | 87.0 | 9.0 | 4.0 | 0.10 | 1240 | 0.09 | 0.96 | 1.22 | 1.17 | 0.11 | 0.0010 |
| Example 5 | 86.0 | 10.0 | 4.0 | 0.10 | 1240 | 0.10 | 0.96 | 1.20 | 1.15 | 0.12 | 0.0010 |
| Example 6 | 85.0 | 11.0 | 4.0 | 0.10 | 1240 | 0.11 | 0.96 | 1.18 | 1.13 | 0.13 | 0.0010 |
| Example 7 | 88.0 | 10.0 | 2.0 | 0.10 | 1240 | 0.10 | 0.98 | 1.10 | 1.08 | 0.11 | 0.0010 |
| Example 8 | 88.0 | 9.0 | 3.0 | 0.10 | 1240 | 0.09 | 0.97 | 1.17 | 1.13 | 0.11 | 0.0010 |
| Example 9 | 88.0 | 7.0 | 5.0 | 0.10 | 1280 | 0.07 | 0.95 | 1.36 | 1.28 | 0.10 | 0.0010 |
| Example 10 | 88.0 | 6.0 | 6.0 | 0.10 | 1300 | 0.06 | 0.94 | 1.50 | 1.40 | 0.09 | 0.0010 |
| Example 11 | 90.0 | 8.0 | 2.0 | 0.10 | 1250 | 0.08 | 0.98 | 1.13 | 1.10 | 0.09 | 0.0010 |
| Example 12 | 87.0 | 11.0 | 2.0 | 0.10 | 1240 | 0.11 | 0.98 | 1.09 | 1.07 | 0.12 | 0.0010 |
| Example 13 | 86.0 | 11.0 | 3.0 | 0.10 | 1240 | 0.11 | 0.97 | 1.14 | 1.10 | 0.13 | 0.0010 |
| Example 14 | 85.0 | 12.0 | 3.0 | 0.10 | 1235 | 0.12 | 0.97 | 1.13 | 1.09 | 0.14 | 0.0010 |
| Example 15 | 90.0 | 5.0 | 5.0 | 0.10 | 1300 | 0.05 | 0.95 | 1.50 | 1.42 | 0.08 | 0.0010 |
| Example 16 | 89.0 | 6.0 | 5.0 | 0.10 | 1280 | 0.06 | 0.95 | 1.42 | 1.34 | 0.09 | 0.0010 |
| Example 17 | 89.0 | 5.0 | 6.0 | 0.10 | 1300 | 0.05 | 0.94 | 1.60 | 1.50 | 0.08 | 0.0010 |
| Example 18 | 86.0 | 8.0 | 6.0 | 0.10 | 1280 | 0.08 | 0.93 | 1.38 | 1.29 | 0.11 | 0.0010 |
| Example 19 | 88.0 | 8.0 | 4.0 | 0.06 | 1240 | 0.08 | 0.96 | 1.25 | 1.20 | 0.10 | 0.0006 |
| Example 20 | 88.0 | 8.0 | 4.0 | 0.08 | 1240 | 0.08 | 0.96 | 1.25 | 1.20 | 0.10 | 0.0008 |
| Example 21 | 88.0 | 8.0 | 4.0 | 0.20 | 1240 | 0.08 | 0.96 | 1.25 | 1.20 | 0.10 | 0.0020 |
| Example 22 | 88.0 | 8.0 | 4.0 | 0.30 | 1240 | 0.08 | 0.96 | 1.25 | 1.20 | 0.10 | 0.0030 |
| Comparative Example 1 | 88.0 | 12.0 | 0.0 | 0.00 | 1260 | 0.12 | 0.97 | 1.00 | 0.97 | 0.12 | 0 |
| Comparative Example 2 | 88.0 | 5.0 | 7.0 | 0.10 | 1300 | 0.05 | 0.93 | 1.70 | 1.57 | 0.09 | 0.0010 |
| Comparative Example 3 | 90.0 | 4.0 | 6.0 | 0.10 | 1300 | 0.04 | 0.94 | 1.75 | 1.64 | 0.07 | 0.0010 |
| Comparative Example 4 | 86.0 | 13.0 | 1.0 | 0.20 | 1240 | 0.13 | 0.99 | 1.04 | 1.03 | 0.14 | 0.0020 |
| Comparative Example 5 | 86.0 | 12.0 | 2.0 | 0.30 | 1240 | 0.12 | 0.98 | 1.08 | 1.06 | 0.13 | 0.0030 |
| Comparative Example 6 | 84.0 | 13.0 | 3.0 | 0.10 | 1240 | 0.13 | 0.97 | 1.12 | 1.08 | 0.15 | 0.0010 |
| Comparative Example 7 | 80.0 | 13.0 | 7.0 | 0.10 | 1300 | 0.13 | 0.92 | 1.27 | 1.17 | 0.17 | 0.0010 |
| Comparative Example 8 | 88.0 | 8.0 | 4.0 | 0.40 | 1240 | 0.08 | 0.96 | 1.25 | 1.20 | 0.10 | 0.0040 |

TABLE 2

| | Piezoelectric constant \| d31 \| (pm/V) | Curie temperature Tc (° C.) | Dielectric loss tangent tanδ (%) | Mechanical quality factor (−) | \| \| Ec1 \| − \| Ec2 \| \| (kV/cm) |
|---|---|---|---|---|---|
| Example 1 | 67.3 | 260 | 0.87 | 283 | 7.7 |
| Example 2 | 72.4 | 285 | 0.89 | 278 | 7.4 |
| Example 3 | 70.2 | 277 | 0.86 | 280 | 7.5 |
| Example 4 | 65.8 | 246 | 0.84 | 271 | 7.2 |
| Example 5 | 64.4 | 235 | 0.82 | 268 | 7.0 |
| Example 6 | 63.1 | 205 | 0.80 | 265 | 6.8 |
| Example 7 | 62.0 | 224 | 0.78 | 211 | 3.3 |
| Example 8 | 64.4 | 242 | 0.81 | 264 | 5.8 |
| Example 9 | 69.4 | 280 | 0.92 | 299 | 8.8 |
| Example 10 | 62.2 | 294 | 0.99 | 301 | 9.2 |
| Example 11 | 61.3 | 250 | 0.72 | 212 | 3.4 |
| Example 12 | 61.4 | 235 | 0.61 | 210 | 2.8 |
| Example 13 | 62.5 | 235 | 0.65 | 253 | 5.1 |
| Example 14 | 60.1 | 192 | 0.69 | 250 | 4.8 |
| Example 15 | 68.4 | 297 | 0.98 | 295 | 8.3 |
| Example 16 | 73.1 | 296 | 0.84 | 298 | 8.5 |
| Example 17 | 61.8 | 298 | 1.21 | 300 | 8.7 |
| Example 18 | 66.8 | 265 | 0.89 | 297 | 8.4 |
| Example 19 | 66.9 | 260 | 0.95 | 241 | 4.3 |
| Example 20 | 67.2 | 260 | 0.85 | 281 | 7.5 |
| Example 21 | 67.0 | 260 | 0.88 | 284 | 7.9 |
| Example 22 | 62.4 | 260 | 1.09 | 255 | 7.3 |
| Comparative Example 1 | 36.9 | 195 | 1.44 | 184 | 0 |
| Comparative Example 2 | 29.4 | 301 | 2.20 | 80 | 0 |
| Comparative Example 3 | 30.4 | 302 | 2.30 | 78 | 0 |
| Comparative Example 4 | 52.3 | 151 | 1.12 | 145 | 0.2 |
| Comparative Example 5 | 57.5 | 169 | 1.24 | 166 | 0.9 |
| Comparative Example 6 | 54.3 | 155 | 1.33 | 158 | 0.8 |
| Comparative Example 7 | 22.4 | 221 | 3.40 | 102 | 0 |
| Comparative Example 8 | 49.5 | 260 | 1.90 | 198 | 1.0 |

Comparative Examples 1 to 8

Next, a comparative piezoelectric material was manufactured in the same manner as in Example 1 with the exception that the mixing ratio of each component in the raw material powder and the maximum baking temperature were changed.

The mixing molar ratio of sodium niobate, barium titanate, the Ba—Nb composite calcined powder (not used in Comparative Example 1), and manganese oxide (not used in Comparative Example 1) and the maximum temperature during baking are as shown in Table 1.

A portion (1 g or more) of each of the piezoelectric materials of Comparative Examples 1 to 8 was pulverized and the crystal structure was specified. The specimens of Comparative Examples 1, 4, 5, 6, and 8 had a substantially single perovskite-type structure, and no tungsten bronze type structure was detected. On the other hand, in the specimens of Comparative Examples 2 and 3 having a large z and Comparative Example 7 having a small y, a perovskite-type structure and a tungsten bronze type structure were mixed.

The compositions (x, y, z, y×z, b, and m) of the piezoelectric materials of Comparative Examples 1 to 8 by the ICP method are as shown in Table 1. The sum of Na, Ba, Nb, Ti, and Mn accounted for 99.9 mol % or more of the metal components excluding oxygen. For Comparative Example 1, Na burned out during baking, and the y value became 0.97.

When the surface of each of the piezoelectric materials of Comparative Examples 1 to 8 was observed with an optical microscope and a SEM in a state after being sintered and the grain size was evaluated, the average equivalent circle diameter of each of the specimens of Comparative Examples 1, 4, 5, 6, and 8 was in a range of from 0.2 μm or more to 50 μm or less, but the average equivalent circle diameter of the specimens of Comparative Examples 2, 3, and 7 was less than 0.2 μm.

Next, in the same manner as in Example 1, comparative piezoelectric elements using the piezoelectric materials of Comparative Examples 1 to 8 were prepared. The shape of the piezoelectric element for evaluation was a rectangular plate shape of 10 mm×2.5 mm 0.5 mm.

Next, in the same manner as in Example 1, the piezoelectric element was subjected to a polarization treatment.

The electrical resistivity of the comparative piezoelectric element that had been subjected to the polarization treatment was $3.6 \times 10^5$ Ω·cm at the minimum in Comparative Example 7, and was $4.0 \times 10^{10}$ Ω·cm at the maximum in Comparative Example 4.

The Curie temperatures obtained in the same manner as in Example 1 are as shown in Table 2. The Curie temperature of the specimens of Comparative Examples 1, 4, 5, and 6 was less than 200° C.

As shown in Table 2, the dielectric loss tangent at room temperature of the piezoelectric element of each of the comparative examples calculated from impedance measurement was larger than 1%, and in particular, the specimens of Comparative Examples 2, 3, 7, and 8 showed a dielectric loss tangent larger than 1.9%.

Table 2 shows the difference between |Ec1| and |Ec2| obtained in the same manner as in Example 1 for the piezoelectric element of each of the comparative examples that had been subjected to the polarization treatment. In the specimens of Comparative Examples 1, 2, 3, and 7, no substantial difference was observed between |Ec1| and |Ec2| The measurement results of polarization-electric field hysteresis for Comparative Example 1 are illustrated in FIG. 7.

Table 2 shows the piezoelectric constants and mechanical quality factors obtained in the same manner as in Example 1 for the piezoelectric element of each of the comparative examples that had been subjected to the polarization treatment.

In Comparative Example 1 in which the z value representing the Ba/Ti ratio was smaller than 1.09 and Mn was not contained, the values of the piezoelectric constant and the Curie temperature were small, and the effect of the present disclosure was not obtained.

In Comparative Example 2 in which the z value was larger than 1.60, although the Curie temperature was high, the piezoelectric constant was significantly small.

In Comparative Example 3 in which the z value was larger than 1.60 and the x value representing the Ti ratio was smaller than 0.05, although the Curie temperature was high, the piezoelectric constant was significantly small. Furthermore, the piezoelectric material of Comparative Example 3 had insufficient mechanical strength, and generated many chips when processed into a strip-shaped specimen.

In Comparative Example 4 in which the x value was larger than 0.12 and the z value was smaller than 1.09, the Curie temperature was significantly low.

In Comparative Example 5 in which the z value was smaller than 1.09, the Curie temperature was low.

In Comparative Example 6 in which the x value was larger than 0.12, the Curie temperature was low.

In Comparative Example 7 in which the y value representing the Na/Nb ratio was smaller than 0.93, the piezoelectric constant was significantly small.

In Comparative Example 8 in which the m value indicating the Mn ratio was larger than 0.0030, the piezoelectric constant was small.

Example 23

A multilayered piezoelectric element of the present disclosure was produced in the following manner.

A PVB binder was added to and mixed with the 900° C. calcined powder before spray-dry granulation in Example 1, and then the mixture was subjected to sheet forming by a doctor blade method, thereby obtaining a green sheet having a thickness of 50 μm.

A conductive paste for internal electrodes was printed on the green sheet. As the conductive paste, a 70% Ag-30% Pd alloy (Ag/Pd=2.33) paste was used. Nine green sheets to which the conductive paste was applied were multilayered, and the multilayered body was baked at 1200° C. for 5 hours to obtain a sintered body. The sintered body was cut into a size of 10 mm×2.5 mm, the side surfaces thereof are then polished, and a pair of external electrodes (first electrode and second electrode) for alternately short-circuiting the internal electrodes were formed by Au sputtering, whereby a multilayered piezoelectric element as illustrated in FIG. 2B was produced.

When a cross section of the obtained multilayered piezoelectric element was observed, the internal electrodes made of Ag—Pd and piezoelectric material layers were alternately formed.

The multilayered piezoelectric element was subjected to a polarization treatment. Specifically, the specimen was heated to 150° C. in an oil bath, a voltage of 2 kV/mm was applied between the first electrode and the second electrode for 30 minutes, and the specimen was cooled to room temperature while the voltage was applied.

When the piezoelectric characteristics of the obtained multilayered piezoelectric element were evaluated, sufficient insulating properties were achieved, a piezoelectric constant, a Curie temperature, and a dielectric loss tangent equivalent to those of the piezoelectric material of Example 1 could be obtained.

Example 24

Using each of the piezoelectric elements of Example 1 and Example 23, a liquid ejection head illustrated in FIG. 3A was produced. When the ejection head was operated, ejection of ink following an input electrical signal was confirmed.

A liquid ejecting apparatus illustrated in FIG. 3B was produced using this liquid ejection head. When the apparatus was operated, ejection of ink following an input electrical signal onto a recording medium was confirmed.

Example 25

Using each of the piezoelectric elements of Example 1 and Example 23, a vibration wave motor (ultrasonic motor) illustrated in FIGS. 4A and 4B was produced. Rotation of the motor according to the application of an AC voltage was confirmed.

Using this vibration wave motor, an optical apparatus illustrated in FIGS. 4C, 4D, and 4E was produced. An autofocus operation according to the application of the AC voltage was confirmed.

Example 26

Using each of the piezoelectric elements of Example 1 and Example 23, a dust removing apparatus illustrated in FIGS. 5A and 5B was produced. When plastic beads were sprayed and an AC voltage was applied, a good dust removal rate was confirmed.

Using this dust removing apparatus, an image pickup apparatus illustrated in FIGS. 5C and 5D was produced. When the image pickup apparatus was energized, dust on the surface of an imaging unit was removed favorably, and an image free from dust defects was obtained.

The piezoelectric material of the present disclosure exhibits good piezoelectricity even at a high environmental temperature. Moreover, since no lead is contained, the burden on the environment is small. Therefore, the piezoelectric material of the present disclosure can be used without problems for apparatuses that widely use a piezoelectric material, such as a liquid ejection head, a vibration wave motor (ultrasonic motor), and a dust removing apparatus.

According to the present disclosure, it is possible to provide a novel piezoelectric material in which the piezoelectric constant and the Curie temperature are simultaneously increased by intentionally shifting the composition ratio of each constituent element from the ideal stoichiometric ratio in the perovskite-type structure.

In addition, the present disclosure can provide a piezoelectric element and an electronic equipment using the piezoelectric material.

Furthermore, since the piezoelectric material used in the piezoelectric element of the present disclosure does not substantially use lead and potassium, the burden on the environment is small, and excellent moisture resistance and storage stability are achieved.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A piezoelectric material comprising:
an oxide containing Na, Ba, Nb, Ti, and Mn,
wherein:
the oxide has a perovskite-type structure,
a total amount of metal elements other than Na, Ba, Nb, Ti, and Mn contained in the piezoelectric material is 0.5 mol % or less with respect to a total amount of Na, Ba, Nb, Ti, and Mn,
a molar ratio x of Ti to a total molar amount of Nb and Ti is $0.05 \leq x \leq 0.12$, and a molar ratio y of Na to Nb is $0.93 \leq y \leq 0.98$,
a molar ratio z of Ba to Ti is $1.09 \leq z \leq 1.60$,
a molar ratio m of Mn to the total molar amount of Nb and Ti is $0.0006 \leq m \leq 0.0030$, and
$1.07 \leq y \times z \leq 1.50$ is satisfied,
wherein the piezoelectric material has a Curie temperature of 235° C. or more, and
wherein the piezoelectric material has a piezoelectric constant $|d_{31}|$ of 61.3 pm/V or more.

2. The piezoelectric material according to claim 1, wherein a molar ratio b of Ba to a total molar amount of Na and Ba contained in the piezoelectric material is $0.08 \leq b \leq 0.13$.

3. The piezoelectric material according to claim 1, wherein a Pb component and a K component contained in the piezoelectric material are less than 1000 ppm in total.

4. A piezoelectric element comprising:
an electrode; and
a piezoelectric material portion,
wherein the piezoelectric material portion is formed of the piezoelectric material according to claim 1.

5. The piezoelectric element according to claim 4, wherein the piezoelectric material portion has polarization-electric field hysteresis characteristics, and when coercive electric fields at two coercive electric field points in the hysteresis characteristics when an applied electric field is swept from −20 kV/cm to 20 kV/cm are referred to as Ec1 and Ec2, a difference between |Ec1| and |Ec2| is 1.0 kV/cm or more.

6. The piezoelectric element according to claim 4, wherein the electrode and the piezoelectric material portion are alternately stacked.

7. A liquid ejection head comprising:
a liquid chamber provided with a vibrating portion in which the piezoelectric element according to claim 4 is disposed; and
an ejection orifice communicating with the liquid chamber.

8. A liquid ejecting apparatus comprising:
a placement portion for a transfer object; and
the liquid ejection head according to claim 7.

9. A vibration wave motor comprising:
a vibrating body in which the piezoelectric element according to claim 4 is disposed; and
a moving body in contact with the vibrating body.

10. An optical apparatus comprising:
the vibration wave motor according to claim 9 in a drive unit.

11. A vibration device comprising:
a vibrating body in which the piezoelectric element according to claim 4 is disposed on a diaphragm.

12. A dust removing apparatus comprising:
the vibration device according to claim 11.

13. An image pickup apparatus comprising:
the dust removing apparatus according to claim 12; and
an image pickup element unit,
wherein the diaphragm of the dust removing apparatus is provided on a light-receiving surface side of the image pickup element unit.

14. An electronic equipment comprising:
the piezoelectric element according to claim 4.

* * * * *